(12) United States Patent
Kim et al.

(10) Patent No.: US 12,302,695 B2
(45) Date of Patent: May 13, 2025

(54) DISPLAY DEVICE

(71) Applicant: SAMSUNG DISPLAY CO., LTD., Yongin-si (KR)

(72) Inventors: Woong Sik Kim, Hwaseong-si (KR); Sang Hyun Lee, Hwaseong-si (KR); Dong Hwan Bae, Seoul (KR); Jin Su Byun, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 614 days.

(21) Appl. No.: 17/403,416

(22) Filed: Aug. 16, 2021

(65) Prior Publication Data

US 2022/0140283 A1  May 5, 2022

(30) Foreign Application Priority Data

Oct. 30, 2020 (KR) .................. 10-2020-0142619

(51) Int. Cl.
*H01L 51/52* (2006.01)
*H01L 27/32* (2006.01)
(Continued)

(52) U.S. Cl.
CPC ....... *H10K 59/873* (2023.02); *H10K 50/8426* (2023.02); *H10K 50/844* (2023.02);
(Continued)

(58) Field of Classification Search
CPC ............. H10K 50/844; H10K 50/8426; H10K 50/858; H10K 50/865; H10K 50/868; H10K 50/86; H10K 50/115; H10K 59/122; H10K 59/38; H10K 59/40; H10K 59/352; H10K 59/353; H10K 59/12; H10K 59/123; H10K 59/127; H10K 59/1275; H10K 59/129; H10K 59/124; H10K 59/121;
(Continued)

(56) References Cited

U.S. PATENT DOCUMENTS

| 2018/0012940 A1 | 1/2018 | Park et al. |
| 2019/0121176 A1* | 4/2019 | Lee .................. G02F 1/133514 |

(Continued)

FOREIGN PATENT DOCUMENTS

| JP | 2009-110873 | 5/2009 |
| JP | 2011-060472 | 3/2011 |

(Continued)

OTHER PUBLICATIONS

Office Action dated Sep. 7, 2024 in corresponding KR Appln. No. 10-2020-0142619.

*Primary Examiner* — Steven H Loke
(74) *Attorney, Agent, or Firm* — F. Chau & Associates, LLC

(57) ABSTRACT

A display device includes an emissive layer between a plurality of first electrodes and a second electrode, an encapsulation layer on the second electrode, an a touch layer on the encapsulation layer. A plurality of refractive patterns are on the touch layer and overlap the emissive layer, and a refractive film covers refractive patterns. Each of the refractive patterns and the refractive film comprise an organic material, and the refractive index of the refractive film is less than the refractive index of each of the refractive patterns.

20 Claims, 20 Drawing Sheets

RPL_5: CFL_B, CFL_G, CFL_R, BM_5

(51) Int. Cl.
    *H10K 50/80*     (2023.01)
    *H10K 50/842*     (2023.01)
    *H10K 50/844*     (2023.01)
    *H10K 50/858*     (2023.01)
    *H10K 50/86*     (2023.01)
    *H10K 59/12*     (2023.01)
    *H10K 59/122*     (2023.01)
    *H10K 59/38*     (2023.01)
    *H10K 59/40*     (2023.01)
    *H10K 59/80*     (2023.01)

(52) U.S. Cl.
    CPC ......... *H10K 50/858* (2023.02); *H10K 50/865* (2023.02); *H10K 50/868* (2023.02); *H10K 59/12* (2023.02); *H10K 59/122* (2023.02); *H10K 59/38* (2023.02); *H10K 59/40* (2023.02); *H10K 59/879* (2023.02); *H10K 59/8792* (2023.02); *H10K 59/8793* (2023.02); *H10K 59/8791* (2023.02)

(58) Field of Classification Search
    CPC ........... H10K 59/1213; H10K 59/1216; H10K 59/128; H10K 59/126; H10K 59/125; H10K 59/131; H10K 59/1315; H10K 59/17–18; H10K 2102/331; H10K 59/80–8794; H10K 59/00–88; H10K 2102/301; H10K 2102/341; H10K 2102/30; H10K 2102/361; H10K 2102/311; H10K 70/00; H10K 71/00–441; H10K 71/831–861; H10K 30/865; H10K 2101/10; H10K 2101/04; H10K 85/00–761; H10K 77/10; H10K 77/111; H10K 2101/00–80; G06F 3/0412; G06F 3/0446; G06F 2203/04112; B32B 2457/206

See application file for complete search history.

(56) References Cited

U.S. PATENT DOCUMENTS

| | | | | |
|---|---|---|---|---|
| 2019/0219875 | A1* | 7/2019 | Jung | G02F 1/133502 |
| 2019/0221779 | A1* | 7/2019 | Jang | H10K 59/38 |
| 2020/0210005 | A1* | 7/2020 | Kim | G06F 3/0412 |
| 2021/0273021 | A1 | 9/2021 | Lee et al. | |
| 2022/0131112 | A1* | 4/2022 | Hinata | H10K 59/873 |
| 2022/0310978 | A1* | 9/2022 | Bao | H10K 59/122 |
| 2023/0221469 | A1* | 7/2023 | Matsusaki | H05B 33/12 |
| | | | | 359/794 |

FOREIGN PATENT DOCUMENTS

| | | | |
|---|---|---|---|
| JP | 5523354 | | 6/2014 |
| KR | 10-2016-0017397 | | 2/2016 |
| KR | 10-2016-0027608 | | 3/2016 |
| KR | 10-2016-0042250 | | 4/2016 |
| KR | 10-1615397 | | 4/2016 |
| KR | 10-2017-0079644 | | 10/2017 |
| KR | 10-2018-0005323 | | 1/2018 |
| KR | 10-2019-0004863 | | 1/2019 |
| KR | 10-2019-0062678 | | 6/2019 |
| KR | 10-2019-0078723 | | 7/2019 |
| KR | 10-2019-0081485 | | 7/2019 |
| KR | 10-2019-0086605 | | 7/2019 |
| KR | 10-2019-0087689 | | 7/2019 |
| KR | 10-2019-0088587 | | 7/2019 |
| KR | 20190095630 | A * | 8/2019 |
| KR | 10-2048924 | | 11/2019 |
| KR | 10-2020-0042981 | | 4/2020 |
| KR | 10-2120808 | | 6/2020 |
| KR | 10-2021-0045554 | | 4/2021 |
| KR | 10-2021-0109716 | | 9/2021 |

* cited by examiner

DISPLAY DEVICE

This application claims priority from Korean Patent Application No. 10-2020-0142619, filed on Oct. 30, 2020, in the Korean Intellectual Property Office, and all the benefits accruing therefrom under 35 U.S.C. 119, the contents of which are incorporated by reference herein.

BACKGROUND

1. Field of the Disclosure

One or more embodiments described herein relate to a display device.

2. Description of the Related Art

Many electronic devices have displays. Examples include a liquid-crystal displays, field emission displays, organic light-emitting displays, inorganic light-emitting displays, and micro-light-emitting display devices. These displays have light emission inefficiencies which degrade performance or image quality.

SUMMARY

One or more embodiments described herein provide a display device with improved light emission efficiency and/ or reduced thickness. It should be noted that objects of the present disclosure are not limited to the above-mentioned object; and other objects of the present invention will be apparent to those skilled in the art from the following descriptions.

In accordance with one or more embodiments, a display device includes a substrate, a plurality of first electrodes on the substrate, a second electrode above the plurality of first electrodes, an emissive layer between the plurality of first electrodes and the second electrode, an encapsulation layer on the second electrode, a touch layer on the encapsulation layer and comprising a touch electrode, a plurality of refractive patterns spaced apart from one another and disposed on the touch layer to overlap the emissive layer, and a refractive film covering the plurality of refractive patterns. Each of the plurality of refractive patterns and the refractive film comprise an organic material, and a refractive index of the refractive film is less than a refractive index of each of the plurality of refractive patterns.

In accordance with one or more embodiments, a display device includes a substrate, a plurality of first electrodes on the substrate, a second electrode above the plurality of first electrodes, an emissive layer between each of the plurality of first electrodes and the second electrode, an encapsulation layer on the second electrode, a touch layer on the encapsulation layer and comprising a touch electrode, a plurality of refractive patterns on the touch layer, and a refractive film covering the plurality of refractive patterns. Each of the plurality of refractive patterns and the refractive film comprises a colorant, and a refractive index of the refractive film is less than a refractive index of each of the refractive patterns.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments of the present disclosure will be described with reference to the accompanying drawings.

Figure 1:
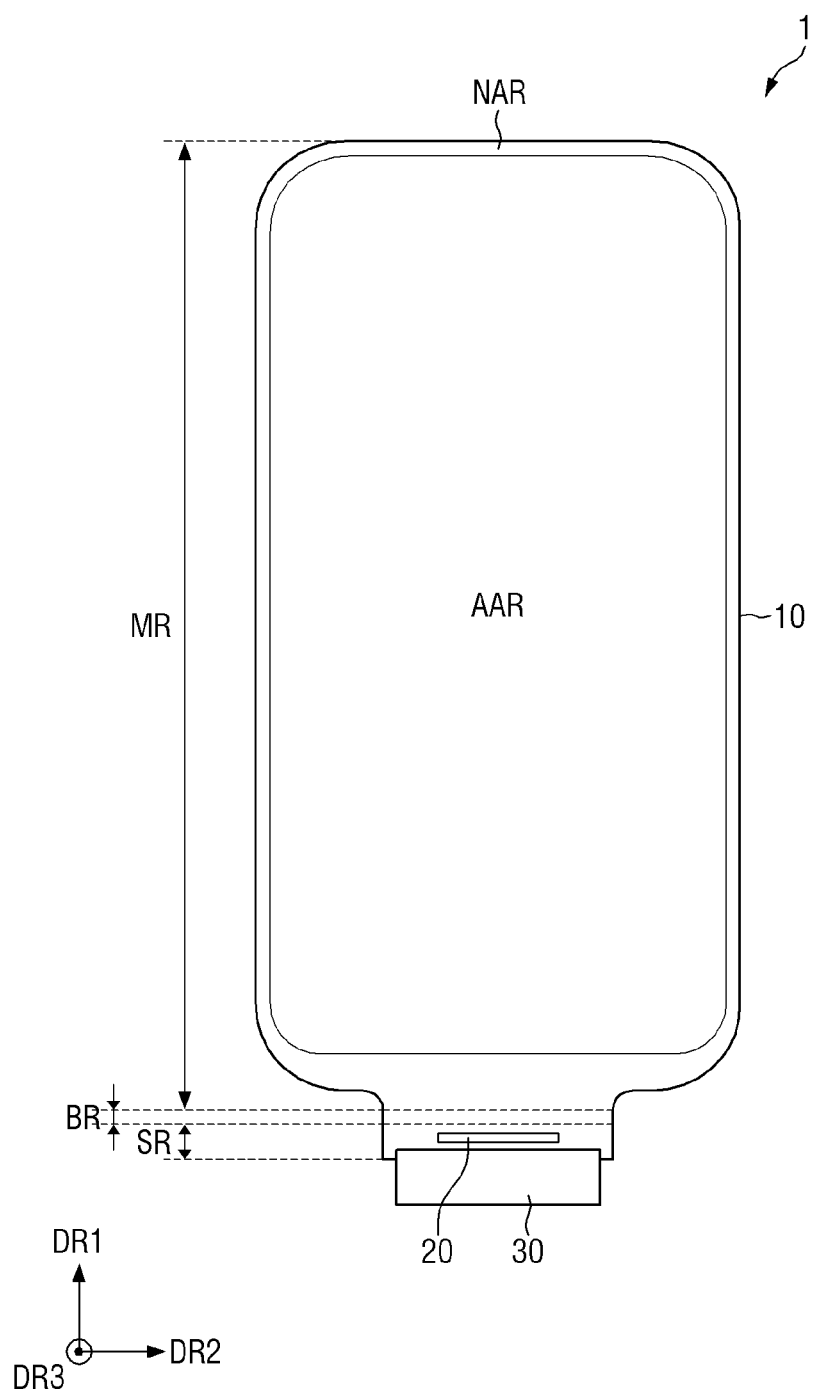
FIG. 1 illustrates an embodiment of a display device.
Figure 2:
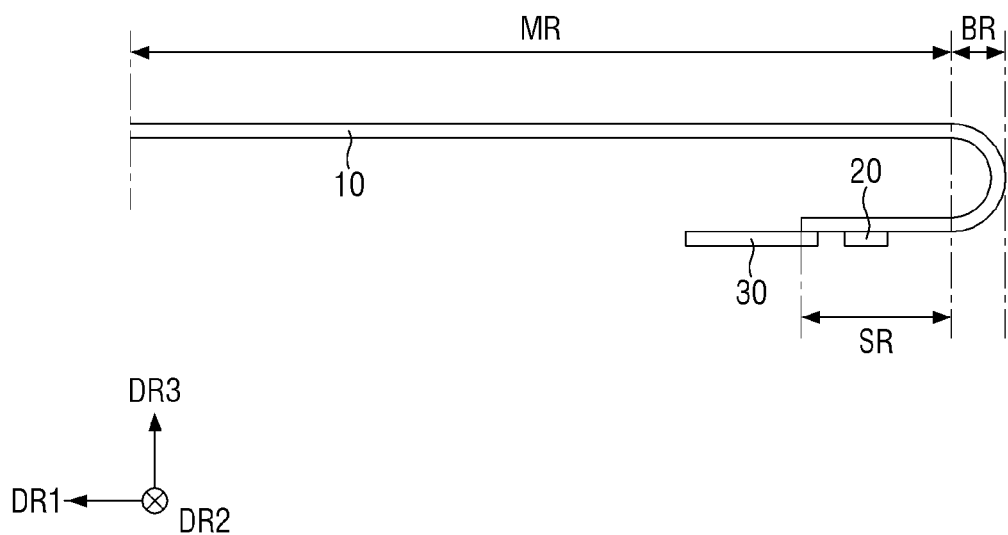
FIG. 2 illustrates an embodiment of a display device.

FIG. 1 is a plan view showing an embodiment of a display device 1, and FIG. 2 is a cross-sectional view of part of a display device according to an embodiment.

In the embodiments, the first direction D1 may intersect the second direction D2. In a plan view of FIG. 1, the first direction DR1 may be the vertical direction and the second direction DR2 may be the horizontal direction for convenience of illustration. In the following description, a first side of the first direction DR1 indicates the upper side, a second side of the first direction DR1 indicates the lower side, a first side of the second direction DR2 indicates the right side, and a second side of the second direction DR2 indicates the left side when viewed from the top.

A third direction DR3 refers to a direction that crosses the plane where the first direction DR1 and the second direction DR2 are located, and the third direction DR3 is perpendicular to both the first direction DR1 and the second direction DR2. It should be understood that the directions referred with respect to the embodiments are relative directions, and the embodiments are not limited to the directions mentioned. As used herein, the terms "top", "upper surface" and "upper side" in the third direction DR3 refer to the display side of a display panel 10, whereas the terms "bottom", "lower surface" and "lower" refer to the opposite side of the display panel 10, unless stated otherwise.

Referring to FIGS. 1 and 2, a display device 1 may refer to any electronic device having or coupled to a display screen. For example, the electronic device may be a portable electronic device including, but not limited to, a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console and a digital camera, as well as a television set, a laptop computer, a monitor, an electronic billboard, and various types of Internet of Things devices.

In the display device 1, a display area may be defined as the area where images are display, a non-display area may be defined as the area where no image is displayed, and a touch area may be defined as the area where a touch input is sensed. In this case, the display device 1 may include an active area AAR and a non-active area NAR. The display area and the touch area may be in the active area AAR and may overlap each other, e.g., images are displayed and touch inputs are sensed in the active area AAR.

The shape of the active area AAR may be a rectangle or a rectangle with rounded corners. In the example shown, the shape of the active area AAR is a rectangle with rounded corners and with sides in the first direction DR1 longer than sides in the second direction DR2. It is, however, to be understood that the present disclosure is not limited thereto. The active area AAR may have various other shapes. Examples include a rectangular shape with sides in the second direction DR2 longer than sides in the first direction DR1, a square shape, other polygonal shapes, a circular shape, and an elliptical shape.

The non-active area NAR is around or adjacent to the active area AAR. The non-active area NAR may include a bezel area and, for example, may surround all or fewer than all sides (four sides in the drawings) of the active area AAR. It is, however, to be understood that the present disclosure is not limited thereto. For example, the non-active area NAR may not be disposed near the upper side of the active region AAR or near the left or right side thereof, or may be disposed around or adjacent to fewer than all sides of the active area AAR.

Signal lines may be in the non-active area NAR for applying signals to various (e.g., driving) circuits in the active area AAR (display area and/or touch area). In one embodiment, the non-active area NAR may include no display area. Further, the non-active area NAR may include no touch area. In another embodiment, the non-active area NAR may include part of the touch area, and a sensor (e.g., pressure sensor) may be disposed in that part. In some embodiments, the active area AAR may be substantially the same as the display area where images are displayed, and/or the non-active area NAR may be substantially the same as the non-display area where no image is displayed.

The display device 1 includes a display panel 10 for providing a display screen. Examples of the display panel 10 include an organic light-emitting display panel, a micro LED display panel, a nano LED display panel, a quantum-dot display panel, a liquid-crystal display panel, a plasma display panel, a field emission display panel, an electrophoretic display panel, and an electrowetting display panel, as well as others. In the following description, an organic light-emitting display panel is employed as an example of the display panel 10, but the present disclosure is not limited thereto. Any other display panel may be employed in the embodiments described herein.

The display panel 10 may include a plurality of pixels arranged in a predetermined pattern, e.g., a matrix. The shape of each pixel may be, but is not limited to, a rectangle or a square in a top view. In one embodiment, each pixel may have a diamond shape with sides inclined with respect to the first direction DR1 and/or the second direction DR2. The pixels may include emission areas with the same or different shapes. Examples of the shapes of the emission areas include a rectangle, a diamond, a hexagon, an octagon, and a circle. Embodiments of the pixels and emission areas are described below.

The display device 1 may include a touch sensor for sensing a touch input. The touch sensor may be implemented as a panel or film separated from the display panel 10 to be attached on the display panel 10 or may be implemented in the form of a touch layer inside or otherwise coupled to the display panel 10. The touch sensor is provided inside a touch panel of be included in the display panel 10 in the description below, for illustration purposes.

In one embodiment, the display panel 10 may include a flexible substrate including a flexible polymer material such as polyimide. Accordingly, the display panel 10 may be curved, bent, folded, or rolled.

The display panel 10 may include a bending region BR, with a main region MR on one side of the bending region BR and a subsidiary region SR on another side of the bending region BR. The display area of the display panel 10 is in the main region MR. According to an embodiment, the edge portions of the display area in the main region MR, all or a portion of the bending region BR and all or a portion of the subsidiary region SR may be the non-display area. It is, however, to be understood that the present disclosure is not limited thereto. In one embodiment, the bending region BR and/or the subsidiary region SR may also include the display area.

The main region MR may have a shape generally similar to the appearance of the display device 1 when viewed from the top. The main region MR may be a flat region located in one plane. It is, however, to be understood that the present disclosure is not limited thereto. At least one of the edges of the main region MR except for the edge (side) connected to the bending region BR may be bent to form a curved surface or may be bent at a right angle.

When at least one of the edges of the main region MR except for the edge (side) connected to the bending region BR is curved or bent, the display area may also be at the edge. It is, however, to be understood that the present disclosure is not limited thereto. The curved or bent edge may be the non-display area that does not display image, or the display area and the non-display area may be disposed together.

The bending region BR is connected to the other side of the main region MR in the first direction DR1. For example, the bending region BR may be connected to the lower shorter side of the main region MR. The width of the bending region BR may be less than the width (width of the shorter side) of the main region MR. The portions where the main region MR meets the bending region BR may be cut in a predetermined shape, e.g., L-shape.

In the bending region BR, the display panel 10 may be bent downward in the thickness direction, e.g., in a direction away from the display surface with a curvature. Although the bending region BR may have a constant radius of curvature, the present disclosure is not limited thereto. It may have different radii of curvature for difference sections. As the display panel 10 is bent at the bending region BR, the surface of the display panel 10 may be reversed. For example, the surface of the display panel 10 facing upward may be bent to face outward at the bending region BR and then faces downward.

The subsidiary region SR may extend from the bending region BR, e.g., the subsidiary region SR may extend in a direction parallel to the main region MR after the display device has been bent. The sub region SR may overlap with the main region MR in the thickness direction of the display panel 10. The width of the subsidiary region SR (the width in the second direction DR2) may be, but is not limited to being, equal to the width of the bending region BR.

A driver chip IC may be in the subsidiary region SR and, for example, may include an integrated circuit for driving the display panel 10. The integrated circuit may include an integrated circuit for display and/or an integrated circuit for a touch unit. The integrated circuit for the display panel and the integrated circuit for the touch unit may be provided as separate chips or may be integrated into a single chip.

The pad area may be at the end of the subsidiary region SR of the display panel 10. The pad unit may include display signal line pads and touch signal line pads. A drive substrate FPC may be connected to the pad unit at the end of the subsidiary region SR of the display panel 10. The drive substrate FPC may be a flexible printed circuit board or a film.

Figure 3:
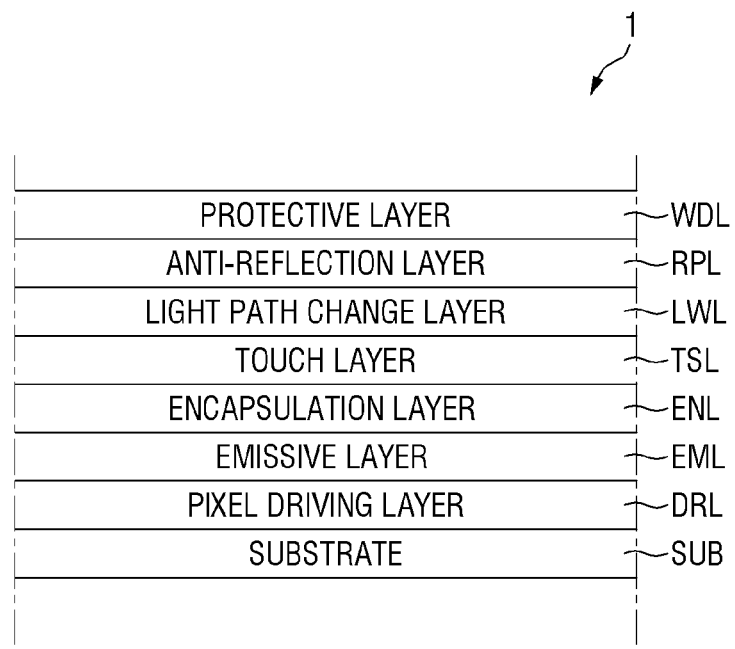
FIG. 3 illustrates an embodiment of a display panel.

FIG. 3 is a cross-sectional view showing an embodiment of a stack structure of the display panel 10, which may include a substrate SUB, a circuit-driving layer DRL, an emissive layer EML, an encapsulation layer ENL, a touch layer TSL, and a light path change layer LWL, an anti-reflection layer RPL, and a protective layer WDL, which are stacked on one another. The substrate SUB may support elements disposed thereon.

The circuit-driving layer DRL may be on the substrate SUB and may include a circuit for driving an emissive layer EML of each pixel. The circuit-driving layer DRL may include a plurality of thin-film transistors.

The emissive layer EML may be on the circuit-driving layer DRL and may include an organic emitting layer. The emissive layer EML may emit light with various luminances depending on driving signals transmitted from the circuit-driving layer DRL.

The encapsulation layer ENL may be on the emissive layer EML and may include an inorganic film or a stack of an inorganic film and an organic film. As another example, glass or an encapsulation film may be employed as the encapsulation layer ENL.

The touch layer TSL may be on the encapsulation layer ENL and may sense a touch input and may perform the functions of the touch sensor (or touch panel). The touch layer TSL may include a plurality of sensing regions and sensing electrodes.

The light path change layer LWL may be on the touch layer TSL and can improve light emission efficiency of light emitted from the emissive layer EML. It is, however, to be understood that the present disclosure is not limited thereto. For example, the light path change layer LWL may reduce reflection of external light or may improve reflected color.

The anti-reflection layer RPL may be on the light path changing layer LWL and may serve to reduce reflection of external light. The anti-reflection layer RLP may be attached in the form of a polarizing film. In such case, the anti-reflection layer RLP may polarize light passing through it, and the anti-reflection layer RPL may be attached on the light path change layer LWL through an adhesive layer. In one embodiment, the anti-reflection layer RPL in the form of a polarizing film may be omitted. The anti-reflection layer RPL may reduce reflection of external light. It is, however, to be understood that the present disclosure is not limited thereto. The anti-reflection layer RPL may be stacked in the form of a color filter layer inside or coupled to the display panel 10. In such case, the anti-reflection layer RPL may include a color filter that selectively transmits light of a particular wavelength, etc.

The protective layer WDL may be on the anti-reflection layer RPL and may include, for example, a window member. The protective layer WDL may be attached on the anti-reflection layer RPL by an optically clear adhesive or the like. An embodiment of the stack structure of the display panel 10 is described later.

Figure 4:
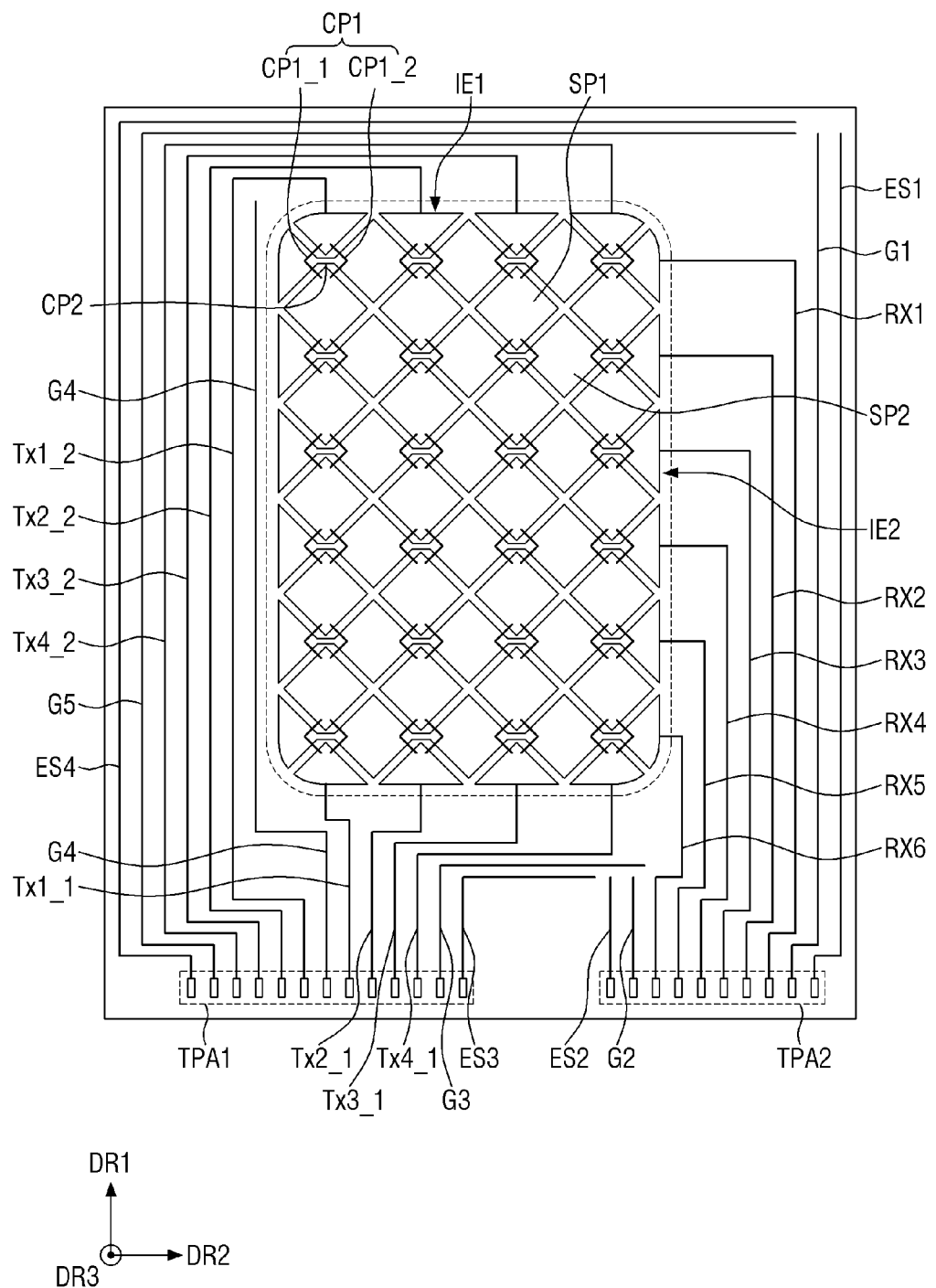
FIG. 4 illustrates an embodiment of a touch member.

FIG. 4 is a schematic plan view of an embodiment of a touch member (or touch sensor), which may include a touch region in the active area AAR and a non-touch region in the non-active area NAR. Although the touch member is simplified while the non-touch region is exaggerated in FIG. 4 for convenience of illustration, the shapes of the touch region and the shape of the non-touch region may be substantially the same to those of the active area AAR and the non-active area NAR described above.

The touch region of the touch member (or touch sensor) may include a plurality of first sensing electrodes IE1 (or first touch electrodes) and a plurality of second sensing electrodes IE2 (or second touch electrodes). The first sensing electrodes IE1 or the second sensing electrodes IE2 may be driving electrodes and the others may be sensing electrodes. In this embodiment, the first sensing electrodes IE1 are driving electrodes and the second sensing electrodes IE2 are sensing electrodes.

The first sensing electrodes IE1 may extend in the first direction DR1, and may include a plurality of first sensor portions SP 1 (arranged in the first direction DR1) and the first connecting parts CP1 electrically connecting between adjacent ones of the first sensor portions SP1. The first sensing electrodes IE1 may be arranged in the second direction DR2.

The second sensing electrodes IE2 may extend in the second direction DR2, and may include a plurality of second sensor portions SP2 arranged in the second direction DR2 and the second connecting parts CP2 electrically connecting between adjacent ones of the second sensor portions SP2. The second sensing electrodes IE2 may be arranged in the first direction DR1. Although four first sensing electrodes IE1 and six second sensing electrodes IE2 are arranged in the drawing, it is to be understood that the numbers of the first sensing electrodes IE1 and the second sensing electrodes IE2 are not limited to the above numerical values.

At least some of the first sensor portions SP1 and the second sensor portions SP2 may have a diamond shape. Some of the first sensor portions SP1 and the second sensor portions SP2 may have a truncated diamond shape. For example, all (or fewer than all) of the first sensor portions SP1 and the second parts SP2 except the first and last ones in the extension direction may have a diamond shape, and each of the first and last ones in the extension direction may have a triangle shape obtained by cutting the diamond shape. The first sensor portions SP1 and the second sensor portions SP2 in the diamond shape may have substantially the same size and shape. The first sensor portions SP1 and the second sensor portions SP2 in the triangle shape may have substantially the same size and shape. It is, however, to be understood that the present disclosure is not limited thereto. The first sensor portions SP1 and the second sensor portions SP2 may have a variety of shapes and sizes.

Figure 5:
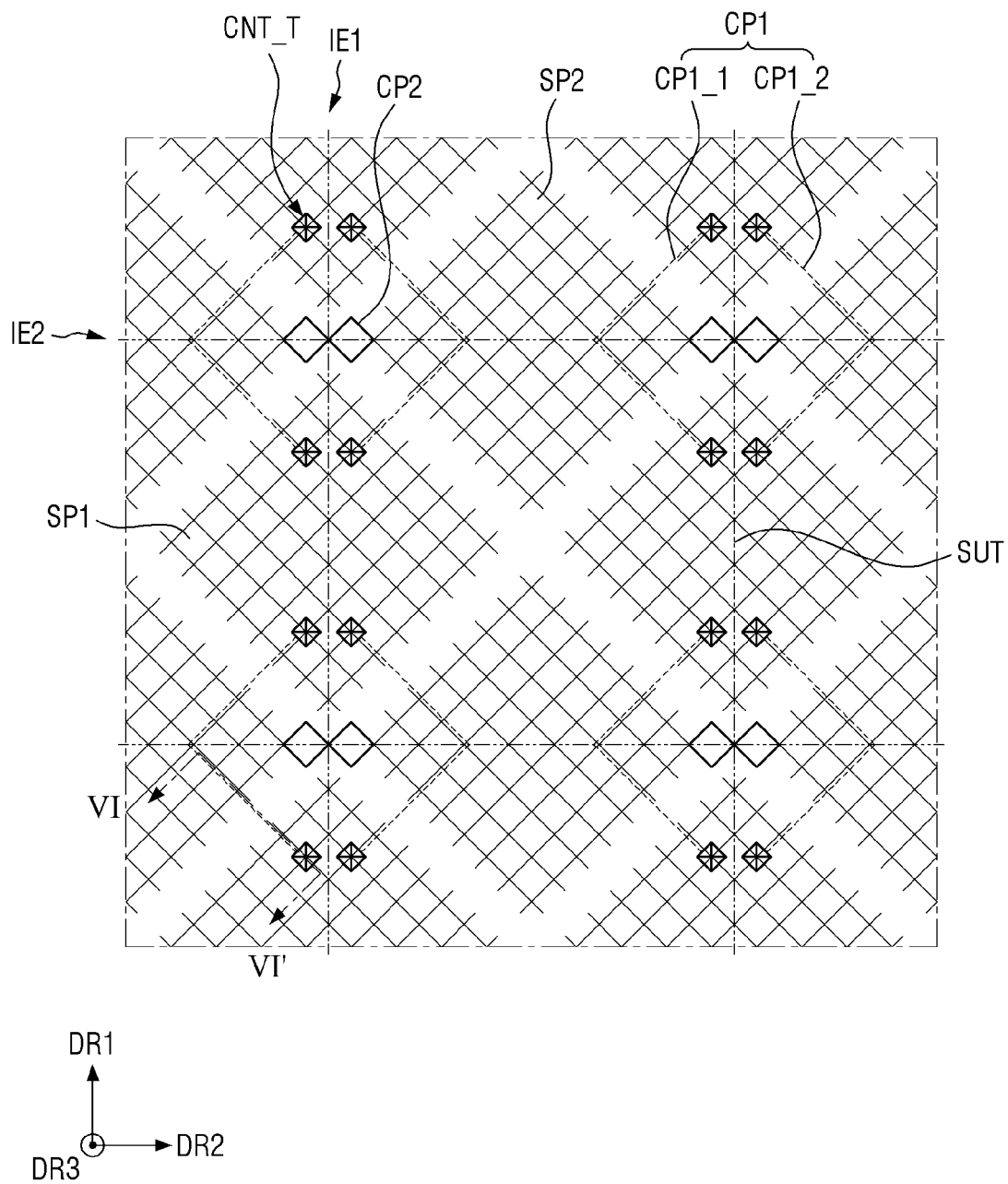
FIG. 5 illustrates an example of part of a touch region.
Figure 7:
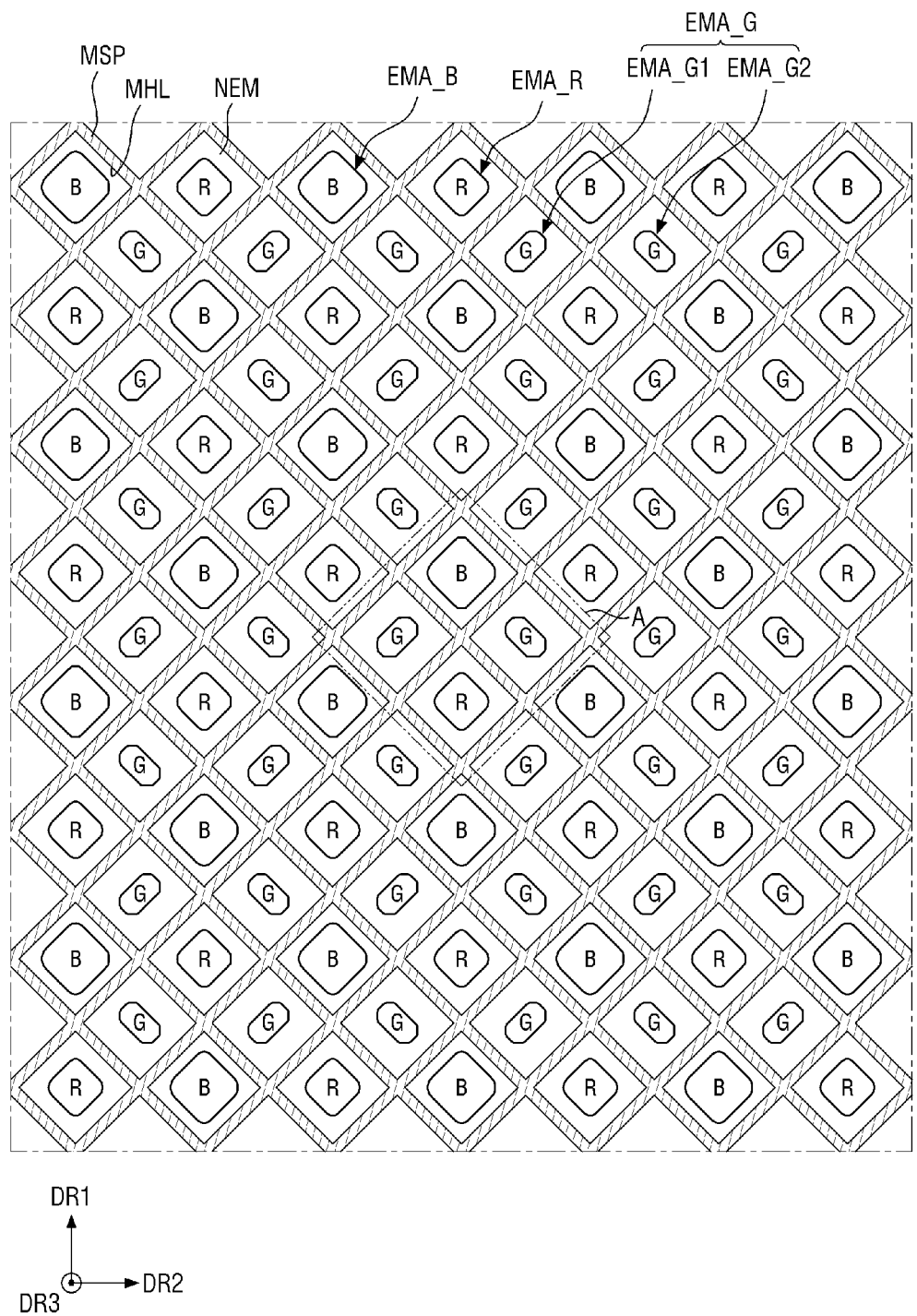
FIG. 7 illustrates an example of a relationship between pixels and a touch member.

The first sensor portions SP1 of the first sensing electrodes IE1 and the second sensor portions SP2 of the second sensing electrodes IE2 may each include a predetermined pattern, e.g., a planar pattern or a mesh pattern. When the first sensor portions SP1 and the second sensor portions SP2 include a planar pattern, the first sensor portions SP1 and the second sensor portions SP2 may be formed as a transparent conductive layer. When the first sensor portions SP1 and the second sensor portions SP2 include a mesh pattern disposed along the non-emission areas as illustrated in FIGS. 5 and 7, it is possible to employ an opaque, low-resistance metal without interfering with the propagation of the emitted light. In the following description, each of the first sensor portions SP1 and the second sensor portions SP2 may include a mesh pattern, but may have a different pattern in another embodiment.

Each of the first connecting parts CP1 may connect a vertex of the diamond or triangle shape of a first sensor portion SP1 with that of an adjacent first sensor portion SP1. Each of the second connecting parts CP2 may connect a vertex of the diamond or triangle shape of a second sensor portion SP2 with that of an adjacent second sensor portion SP2. The width of the first connecting parts CP1 and the second connecting parts CP2 may be less than the width of the first sensor portions SP1 and the second sensor portions SP2.

The first sensing electrodes IE1 and the second sensing electrodes IE2 may be insulated from each other and intersect each other. The first sensing electrodes IE1 are connected to one another by a conductive layer and the second sensing electrodes IE2 are connected to one another by another conductive layer on a different layer at the intersections, such that the first sensing electrodes IE1 can be insulated from the second sensing electrodes IE2. The first sensing electrodes IE1 can be connected to one another by the first connecting parts CP1 while the second sensing electrodes IE2 can be connected to one another by the second connecting parts CP2, so that they can be insulated from each other while intersecting each other. To do so, the first connecting parts CP1 and/or second connecting parts CP2 may be on a different layer from the first sensing electrode IE1 and second sensing electrode IE2.

For example, the first sensor portions SP1 of the first sensing electrodes IE1 and the second sensor portions SP2 of the second sensing electrodes IE2 may be formed as a conductive layer on the same layer, and the first sensor portions SP1 and the second sensor SP2 may neither intersect nor overlap with each other. The adjacent ones of the first sensor portions SP1 and second sensor portions SP2 may be physically separated from each other.

The second connecting parts CP2 may be formed as the same conductive layer as the second sensor portions SP2 and may connect the adjacent ones of the second sensor portions SP2. A first sensor portion SP1 of a first sensing electrode IE1 is physically separated from an adjacent sensor portion SP1 thereof with respect to the area where a second connecting part CP2 passes. The first connecting parts CP1 connecting the first sensor portions SP1 with one another may be formed as a different conductive layer from the first sensor portions SP1 and may traverse the area of the second sensing electrodes IE2. Each of the first connecting parts CP1 may be electrically connected to the respective first sensor portions SP1 by a contact.

In one embodiment, there may be more than one first connecting parts CP1. For example, each of the first connection parts CP1 may include a first connecting part CP1_1 which overlaps an adjacent second sensing electrode IE2 on one side, and another first connecting part CP1_2 which overlaps another adjacent second sensing electrode IE2 on the other side. As more than one first connecting parts CP1 connect between two adjacent ones of the first sensor portions SP1, disconnection of the first sensing electrodes IE1 may be prevented even if when any of the first connecting parts CP1 is broken by static electricity or the like.

The first sensor portions SP1 and the second sensor portions SP2 adjacent to each other may form a unit sensing region SUT (e.g., see FIG. 5). For example, halves of two adjacent first sensor portions SP1 and halves of two adjacent second sensor portions SP2 may form a square or a rectangle, with respect to the intersection between the first sensing electrodes IE1 and the second sensing electrodes IE2. The area defined by the halves of the adjacent two first sensor portions SP1 and halves of the two adjacent second sensor portions SP2 may correspond to a unit sensing region SUT. A plurality of unit sensing regions SUT may be arranged in row and column directions.

In each of the unit sensing regions SUT, the capacitance value between the adjacent first sensor portions SP1 and the second sensor portions SP2 may be measured to sense a touch input. If so, the position of the touch input may be determined to correspond to touch input coordinates. For example, a touch may be sensed by, for example, measuring mutual capacitance. In another embodiment, the touch sensor may be a resistive-type sensor for detecting the input and location of a touch.

Each unit sensing region SUT may be larger than the size of a pixel. For example, each unit sensing region SUT may have an area equal to the area occupied by a plurality of pixels. The length of a side of the unit sensing region SUT may be in the range of, but is not limited to, about 4 to about 5 mm.

A plurality of touch signal lines is in the non-active area NAR outside the touch region. The touch signal lines may extend from the touch pad units TPA1 and TPA2 in the subsidiary region SR to the non-active area NAR of the main region MR through the bending region BR.

The touch signal lines may include touch driving lines TX and touch sensing lines RX. In an embodiment, the touch signal lines may further include touch ground lines G and/or touch antistatic lines ES. The touch driving lines TX are connected to the first sensing electrodes IE1. In an embodiment, a plurality of touch driving lines may be connected to a single first sensing electrode IE1, e.g., the touch driving lines may include first touch driving lines TX1_1, TX2_1, TX3_1 and TX4_1 connected to the lower end of the first sensing electrodes IE1, and second touch driving lines TX1_2, TX2_2, TX3_2 and TX4_2 connected to the upper end of the first sensing electrodes IE1. The first touch driving lines TX1_1, TX2_1, TX3_1 and TX4_1 may extend from a touch signal line pad TPA1 (as indicated by the upper arrow in the first direction DR1) and may be connected to the lower end of the first sensing electrodes IE1. The second touch driving lines TX1_2, TX2_2, TX3_2 and TX4_2 may extend from the touch signal line pad unit TPA1 (as indicated by the upper arrow in the first direction DR1) and may go along the left edge of the touch region to be connected to the upper end of the first sensing electrodes IE1.

The touch sensing lines RX are connected to the second sensing electrodes IE2. In an embodiment, a single touch sensing line RX may be connected to a single second sensing electrode IE2. The touch sensing lines RX1, RX2, RX3, RX4, RX5 and RX6 may extend from a touch signal line pad unit TPA2 (as indicated by the upper arrow in the first direction DR1) and may go along the right edge of the touch region to be connected to the right end of the second sensing electrodes IE2.

The touch antistatic lines ES may be at the outermost portion of the touch signal lines. In an embodiment, the touch antistatic lines may include a first touch antistatic line ES1, a second touch antistatic line ES2, a third touch antistatic line ES3, and a fourth touch antistatic line ES4. The first to fourth touch antistatic lines ES may surround the touch region and the signal lines in a predetermined shape, e.g., a ring shape.

The first touch antistatic line ES1 may cover a touch signal line on the right side from its outer side. The second touch antistatic line ES2 may cover a touch signal line on the right side from its inner side. A third touch electrostatic discharge line ES3 may cover the inner side of a touch signal line on the left side and the outer side of a touch signal line extending in the second direction DR2 on the lower side of the touch region. A fourth touch electrostatic discharge line ES4 may cover the outer side of a touch signal line located on the left side and the outer side of a touch signal line extending in the second direction DR2 on the lower side of the touch region.

The touch ground lines G may be between the signal lines, and may include a first touch ground line G1, a second touch ground line G2, a third touch ground line G3, a fourth touch ground line G4 and a fifth touch ground line G5. The first touch ground line G1 may be between the touch sensing lines RX and the first touch electrostatic discharge line ES1. The second touch ground line G2 may be between the second touch electrostatic discharge line ES and the touch sensing lines RX. The third touch ground line G3 may be between the first touch driving line TX_1 and the third touch electrostatic discharge line ES3. The fourth touch ground line G4 may be between the first touch driving line TX_1 and the second touch driving line TX_2. The fifth touch ground line G5 may be between the second touch driving line TX_2 and the fourth touch electrostatic discharge line ES4.

Figure 6:
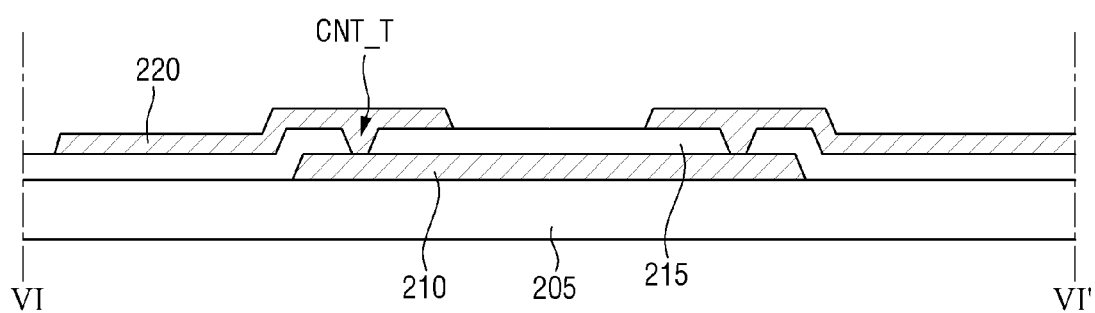
FIG. 6 illustrates a cross-sectional view along line VI-VI' in FIG. 5.

FIG. 5 is an enlarged view of part of the touch region of FIG. 4, and FIG. 6 is a cross-sectional view taken along line VI-VI' of FIG. 5 according to embodiments.

Referring to FIGS. 4 to 6, the touch member may include a base layer 205, a first touch conductive layer 210 on the base layer 205, a first touch insulating layer 215 on the first touch conductive layer 210, and a second touch conductive layer 220 on the first touch insulating layer 215. The first touch conductive layer 210 is on the base layer 205 and is covered by the first touch insulating layer 215. The first touch insulating layer 215 insulates the first touch conductive layer 210 from the second touch conductive layer 220. The second touch conductive layer 220 is on the first touch insulating layer 215, and the second touch insulating layer 230 covers and protects the second touch conductive layer 220.

The base layer 205 may include an inorganic insulating material. For example, the base layer 205 may include a silicon nitride layer, a silicon oxynitride layer, a silicon oxide layer, a titanium oxide layer, or an aluminum oxide layer. In some embodiments, the base layer 205 may further include or be replaced with a second inorganic film 193 forming a thin encapsulation layer to be described later.

Each of the first touch conductive layer 210 and the second touch conductive layer 220 may include a metal or a transparent conductive layer. The metal may include aluminum, titanium, copper, molybdenum, silver, or an alloy thereof. The transparent conductive layer may include a transparent conductive oxide such as indium tin oxide (ITO), indium zinc oxide (IZO), zinc oxide (ZnO) and indium tin zinc oxide (ITZO), a conductive polymer such as PEDOT, metal nanowire, grahpene, etc. As described above, when the first touch conductive layer 210 and the second touch conductive layer 220 are on the non-emission area, they do not interfere with propagation of the emitted light even if they are an opaque, low-resistance metal.

The first touch conductive layer 210 and/or the second touch conductive layer 220 may include a multi-layered conductive layer. For example, the first touch conductive layer 210 and/or the second touch conductive layer 220 may have a three-layer structure of titanium/aluminum/titanium.

In an embodiment, the first connecting parts CP1 may be formed as the first touch conductive layer 210 and the first sensor portions SP1, the second sensor portions SP2 and the second connecting parts CP2 may be formed as the second touch conductive layer 220. It is, however, to be understood that the present disclosure is not limited thereto. The first connecting parts CP1 may be formed as the second touch conductive layer 220 and the sensor portions SP1 and SP2 and the second connecting parts CP2 may be formed as the first touch conductive layer 210. The touch signal lines may be formed as the first touch conductive layer 210 or the second touch conductive layer 220. In one embodiment, they may be formed as the first touch conductive layer 210 and the second touch conductive layer 220 connected by a contact. Besides, the touch conductive layers forming the elements of the sensing electrodes and the signal lines may be modified in a variety of ways.

The first touch insulating layer 215 may include an inorganic material or an organic material. In an embodiment, the first touch insulating layer 215 may include an inorganic material. According to an embodiment, the first touch insulating layer 215 may include a silicon nitride layer, a silicon oxynitride layer, a silicon oxide layer, a titanium oxide layer, an aluminum oxide layer, etc.

The first touch insulating layer 215 may include a contact hole CNT_T. The first touch conductive layer 210 (e.g., the first connecting part CP1) and a part of the second touch conductive layer 220 (e.g., the first sensor portion SP1) may be electrically to each other through the contact hole CNT_T. In addition, an insulating layer may be further disposed on the second touch conductive layer 220. The insulating layer may include an inorganic material or an organic material. When the insulating layer includes an organic material, it may have a flat upper surface despite the level differences thereunder.

FIG. 7 is a diagram showing an embodiment of an arrangement relationship between the pixels and the touch member in a mesh pattern in the display area.

Referring to FIG. 7, the display area of the active area AAR includes a plurality of pixels, each of including an emission area EMA. The emission area EMA overlaps with an opening of a bank layer 126 (e.g., see FIG. 9) and may be there delineated. A non-emission area NEM is between the emission area EMA of a pixel and the emission area EMA of another pixel. The non-emission area NEM overlaps with the bank layer 126 (e.g., see FIG. 9) and may be there delineated. The non-emission area NEM may surround the emission area EMA. The non-emission area NEM has a lattice shape or a mesh shape arranged along the diagonal directions intersecting with the first direction DR1 and the second direction DR2 when viewed from the top.

The mesh pattern MSP is in the non-emission area NEM and may be substantially the same as at least one of the first touch conductive layer 210 or the second touch conductive layer 220 described above with reference to FIGS. 4 to 6.

The pixels may include first color pixels (e.g., red pixels), second color pixels (e.g., blue pixels), and third color pixels (e.g., green pixels). The shape of the emission area EMA of each color pixel may be, for example, an octagon, a square or a diamond with rounded corners. It is, however, to be understood that the present disclosure is not limited thereto. The shape of each emission area EMA may be a circle, a diamond, or other polygons or shapes with or without rounded corners.

In an embodiment, the emission area EMA_R of the first color pixel and the emission area EMA_B of the second color pixel may have similar shapes such as a diamond shape with rounded corners. The emission area EMA_B of the second color pixel may be larger than the emission area EMA_R of the first color pixel.

The emission area EMA_G of the third color pixel may be smaller than the emission area EMA_R of the first color pixel. The emission area EMA_G of the third color pixel may have an octagon shape that is inclined in a diagonal direction and, for example, may have the maximum width in the inclined direction. The third color pixels may include third color pixels in which an emission area EMA_G1 is inclined in a first diagonal direction, and third color pixels in which an emission area EMA_G2 is inclined in a second diagonal direction.

The color pixels may be arranged in a variety of ways. In an embodiment, the first color pixels (e.g., red pixels) and the second color pixels (e.g., blue pixels) may be alternately arranged in the second direction DR2 to form a first row. The third color pixels (e.g., green pixels) may be arranged in the second direction DR2 to form a second row next to the first row. The pixels belonging to the second row (the third color pixels) may be arranged in a staggered manner in the second direction DR2 with respect to the pixels belonging to the first row. In the second row, the third color pixels that are inclined in the first diagonal direction and the third color pixels that are inclined in the second diagonal direction may be alternately arranged in the second direction DR2. The number of the third color pixels belonging to the second row may be twice the number of the first color pixels or the number of the second color pixels belonging to the first row.

In the third row, the color pixels of the same colors as the first row may be arranged in the reversed order. For example, in a column of the first row where a first color pixel is disposed, a second color pixel is disposed in the same column of the third row. In a column of the first row where a second color pixel is disposed, a first color pixel is in the same column of the third row. In the fourth row, the third color pixels are arranged like the second row but they may be arranged in the reversed order in view of the shapes inclined with respect to the diagonal directions. For example, in a column of the second row where a third color pixel inclined in the first diagonal direction is disposed, a third color pixel inclined in the second diagonal direction is disposed in the same column of the fourth row. In a column of the second row where a third color pixel inclined in the second diagonal direction is disposed, a third color pixel inclined in the first diagonal direction is disposed in the same column of the fourth row.

The arrangement of the first to fourth rows may be repeated in the first direction DR1. It is to be understood that the arrangement of the pixels is not limited to the above example.

The mesh pattern MSP may be disposed along the boundaries of the pixels in the non-emission area NEM. The mesh pattern MSP may not overlap with the emission area EMA. The width of the mesh pattern MSP may be less than the width of the non-emission area NEM. In an embodiment, mesh holes MHL exposed by the mesh pattern MSP may have a substantially diamond shape. The mesh holes MHL may have the same size. In one embodiment, the mesh holes MHL may have different sizes depending on the size of the emission area EMA exposed via the mesh holes MHL or regardless of it. Although a single mesh hole MHL is formed in a single emission area EMA in the drawing, this is merely illustrative. In some implementations, a single mesh hole MHL may be formed across two or more emission areas EMA.

Figure 8:
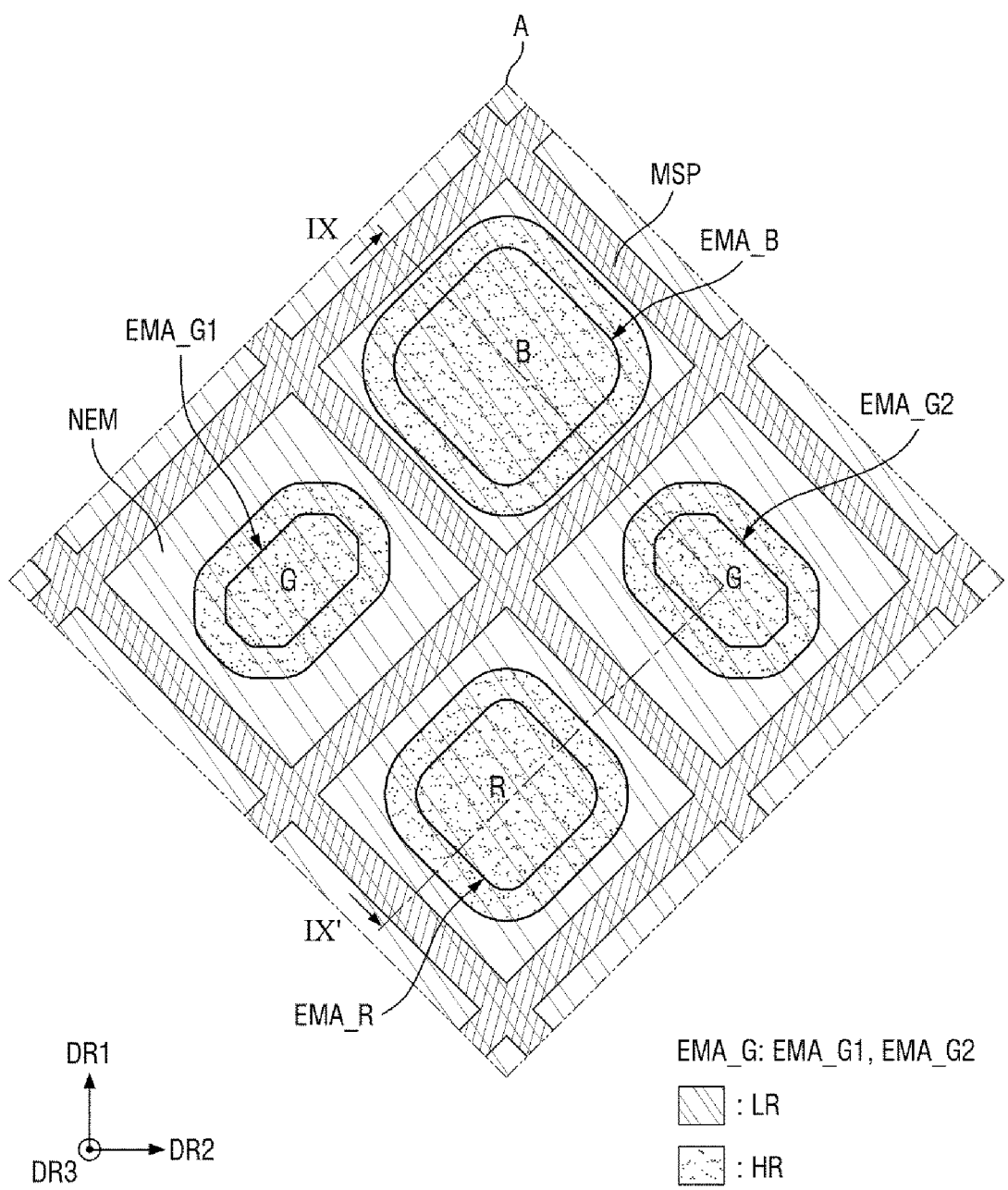
FIG. 8 illustrates an example of area A in FIG. 7.
Figure 9:
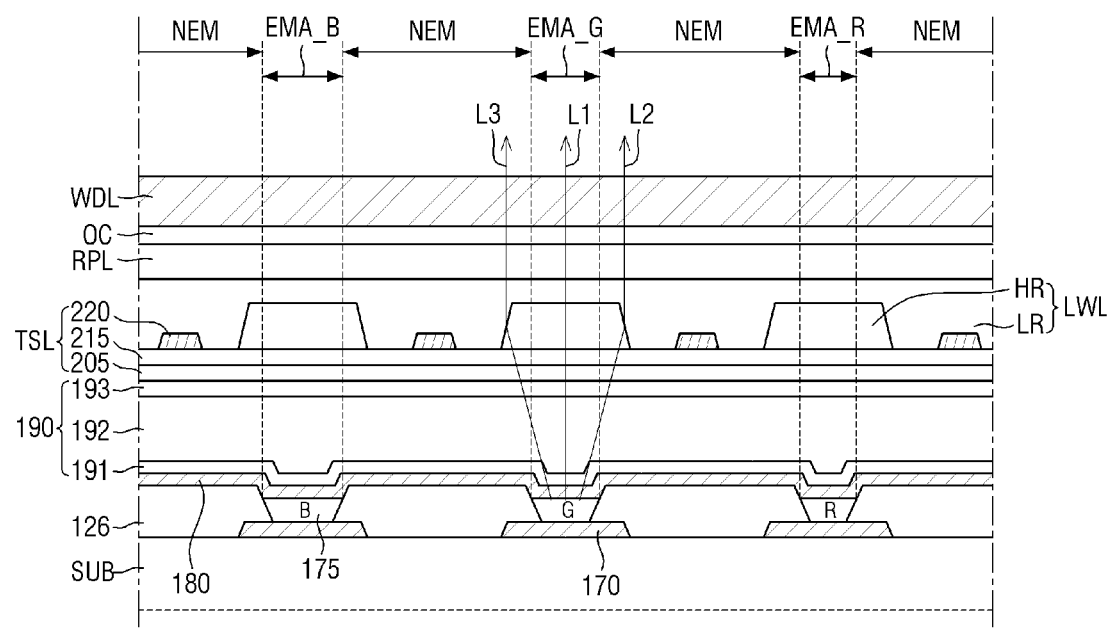
FIG. 9 illustrates a cross-sectional view along line IX-IX' in FIG. 8.

FIG. 8 illustrates an enlarged view of area A of FIG. 7 according to an embodiment, and FIG. 9 illustrates a cross-sectional view taken along line IX-IX' of FIG. 8. In the cross-sectional view of FIG. 9, most of the layers under an anode electrode 170 are not shown and the structure above an organic light-emitting element is mainly shown.

Referring to FIGS. 8 and 9, a substrate SUB of the display device 1 may include an insulating material such as a polymer resin Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. The substrate 100 may be a flexible substrate that can be bent, folded, or rolled. An example of the material of the flexible substrate may be, but is not limited to, polyimide (PI).

The anode electrode 170 is on the substrate SUB, and in one embodiment may be disposed directly on the substrate SUB. A plurality of thin-film transistors and signal lines are also provided, and in one embodiment may be between the substrate SUB and the anode electrode 170.

The anode electrode 170 may be a pixel electrode in each of the pixels. The anode electrode 170 may have, for example, a stack structure of a material layer having a high work function. Examples include indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof. The layer having a high work function may be above the reflective material layer, so that it is closer to the organic layer 175 The anode electrode 170 may have, but is not limited to, a multilayer structure of ITO/Mg, ITO/MgF, ITO/Ag, and ITO/Ag/ITO.

The bank layer 126 may be on the substrate SUB and over the anode electrode 170, and may include an opening exposing the anode electrode 170. The emission area EMA and the non-emission area NEM may be separated by the bank layer 126 and the opening thereof. The bank layer 126 may include an organic insulating material, such as polyacrylate resin, epoxy resin, phenolic resin, polyamide resin, polyimide resin, unsaturated polyesters resin, poly phenylen ether resin, poly phenylene sulfide resin, and benzocyclobutene (BCB). The bank layer 126 may include an inorganic material.

The bank layer 126 may include a light-absorbing material, which may include, for example, an inorganic black pigment such as carbon black or an organic black pigment, may include a black dye, etc., or may include a pigment or dye having a color other than black. Accordingly, it is possible to suppress or prevent light emitted from the emissive layer from being directed toward the side surface and to suppress or prevent reflection of external light. Furthermore, it is possible to suppress or prevent defects such as light leakage even without any polarizing film.

The emissive layer is on the anode electrode 170 exposed via the bank layer 126. The emissive layer may include an organic layer 175, which includes an organic emitting layer and which may further include a hole injecting/transporting layer and/or an electron injecting/transporting layer.

A cathode electrode 180 may be on the organic layer 175 and may be a common electrode disposed across the pixels. The anode electrode 170, the organic layer 175 and the cathode electrode 180 may form an organic light-emitting element. The cathode electrode 180 may be in contact with the organic layer 175, as well as the upper surface of the bank layer 126. The cathode electrode 180 may be formed conformally to the underlying features to reflect the level differences of the underlying features. The cathode electrode 180 may include a material layer having a small work function. Examples include Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The cathode electrode 180 may further include a transparent metal oxide layer on the material layer having a small work function.

A thin encapsulation layer 190 may be on the cathode electrode 180 and may include a first inorganic film 191, an organic film 192 and a second inorganic film 193. Each of the first inorganic film 191 and the second inorganic film 193 may include silicon nitride, silicon oxide, silicon oxynitride, or the like. The organic film 192 may include an organic insulating material such as polyacrylate resin, epoxy resin, phenolic resin, polyamide resin, polyimide resin, unsaturated polyesters resin, polyphenylene ether resin, polyphenylene sulfide resin, and benzocyclobutene (BCB).

The touch layer TSL may be on the thin-film encapsulation layer 190, and the base layer 205, the first touch insulating layer 215 and the second touch conductive layer 220 may be sequentially disposed. Redundant descriptions on the layers will be omitted. FIG. 9 is a cross-sectional view of the sensor portion, and therefore the first touch conductive layer 210 is not shown in the cross-sectional view.

The second touch conductive layer 220 may overlap with the bank layer 126 and may be in the non-emission area NEM. The second touch conductive layer 220 forms the mesh pattern MSP of the sensor portions and does not interfere with emission of light and is not seen by a viewer because it does not overlap with the emission area EMA.

The light path change layer LWL may be on the first touch insulating layer 215 and may include a high-refractive pattern HR and a low-refractive film LR having different refractive indices. The refractive index of the high-refractive pattern HR may be greater than the refractive index of the low-refractive film LR. In one embodiment, the refractive index of the high-refractive pattern HR may range from, but is not limited to, about 1.53 to about 1.8 or about 1.5 to about 5. In one embodiment, the refractive index of the low-refractive film LR may range from about 1.46 to about 1.48 or may be greater than about 1 and less than about 1.5.

In one embodiment, a plurality of high-refractive patterns HR may be included and may be spaced apart from one another. When a plurality of high-refractive patterns HR is disposed, the high-refractive patterns HR may be separated from one another, for example, by the low-refractive film LR. The high-refractive pattern HR may be in the emission area EMA and may cover the respective emission area EMA. The high-refractive patterns HR may be over the entire (or less than all of the) emission area EMA and may be larger than the emission area EMA when viewed from the top. For example, each emission area EMA may entirely (or partially) overlap the high-refractive pattern HR in the thickness direction (the third direction DR3), and the organic layer 175 of the emissive layer may entirely (or partially) overlap the high-refractive pattern HR in the thickness direction (the third direction DR3).

The high-refractive pattern HR may include a taper angle θ between the lower surface and the side surfaces. For example, the side surfaces of the high-refractive pattern HR may form the taper angle θ with the first touch insulating layer 215 on which the high-refractive patterns HR is disposed. The taper angle θ may have a range from, for example, greater than about 0 degrees and less than or equal to about 80 degrees, or may have a range from about 50 degrees to about 80 degrees. It is, however, to be understood that the present disclosure is not limited thereto and the taper angle θ may be in other ranges.

The thickness of the high-refractive pattern HR may range from, but is not limited to, about 1.2 μm to about 2.5 μm or about 0.1 μm to about 3 μm. The thickness of the high-refractive pattern HR refers to the thickness from the interface between the high-refractive pattern HR and the first touch insulating layer 215 to the upper surface of the high-refractive pattern HR, and may indicate the average thickness of each high-refractive pattern HR.

When viewed from the top, the distance (on one side) between the side surface of the high-refractive pattern HR and the side surface of the organic layer 175 of the emissive layer may range from, but is not limited to, about 2.5 μm to about 4.0 μm, or about 1.5 μm to about 5 μm. The distance between the side surface of the high-refractive pattern HR and the side surface of the organic layer 175 of the emissive layer may refer to the distance between the edge where the lower surface and the side surface of the high-refractive pattern HR meet and the edge where the upper surface and side surface of the organic layer 175 meet when viewed from the top.

The low-refractive film LR may be over the high-refractive pattern HR and may cover the upper and side surfaces of the high-refractive pattern HR. The low-refractive film LR may be formed as, but is not limited to, a single piece. The low-refractive film LR may be across the emission area EMA and the non-emission area NEM. In the emission area EMA, the low-refractive film LR may be over the high-refractive pattern HR. Light emitted from the emissive layer may sequentially pass through the high-refractive patterns HR and the low-refractive film LR. In other words, the light emitted from the emissive layer may pass through the high-refractive patterns HR and then may pass through the low-refractive film LR.

Even though light L1 emitted from the emissive layer passes through the high-refractive pattern HR in the emission area EMA and then travels toward the low-refractive film LR from the high-refractive pattern HR, the light does not undergo total reflection at the upper surface of the high-refractive pattern HR. This is because the incidence angle is less than the critical angle of total reflection. Accordingly, the light emission efficiency of the light L1 emitted from the emissive layer may not be reduced.

The thickness of the low-refractive film LR may be from, but is not limited to, about 3 μm to about 10 μm, or about 3 μm to about 30 μm. The thickness of the low-refractive film LR may refer to the thickness from the interface between the low-refractive film LR and the first touch insulating layer 215 to the upper surface of the low-refractive film LR, and may indicate the average thickness of the entire (or a part of) low-refractive film LR.

Each of the high-refractive patterns HR and the low-refractive film LR may include an organic material. The organic material may include, for example, at least one selected from the group consisting of: acrylic resin, epoxy resin, phenolic resin, polyamide resin, polyimide resin, etc. It is, however, to be understood that the organic material is not limited thereto and may include different materials in another embodiments.

When the low-refractive film LR includes an organic material, no additional planarization layer is required. For example, the low-refractive film LR over the high-refractive pattern HR may have a generally flat upper surface despite the level differences created by the high-refractive pattern HR and the second touch conductive layer 220. Accordingly, no additional element for provide a flat surface for the optical path change layer LWL may be required. As a result, process efficiency can be improved and process cost can be reduced.

The high-refractive pattern HR may include a metal type or an organic or inorganic type, high-refractive material. The high-refractive pattern HR may include first nanoparticles. In one embodiment, the first nanoparticles may further include zirconia. The zirconia may include, but is not limited to, yttria stabilized zirconia (YSZ). In one embodiment, the first nanoparticles may include at least one selected from the group consisting of: silver (Ag), platinum (Pt), zinc oxide (ZnOx), cadmium selenide (CdSe), plumbum zirconate titanate (PZT), lead zirconate titanate (PLZT), which is a light-transmitting ceramic, titanate barium titanate (BaTiO$_3$), aluminum oxide (Al$_2$O$_3$), copper (Cu), nickel (Ni), etc. It is, however, to be understood that the present disclosure is not limited thereto. The material that may be included in the high-refractive patterns HR is not limited, as long as it is a material having a refractive index within the above-described range or a mixture of a plurality of materials.

The low-refractive film LR may further include fluorinated monomers, and may further include low-viscosity acrylic monomers and high-viscosity acrylic monomers. In one embodiment, the low-refractive film LR may further include second nanoparticles. The second nanoparticles may be one selected from the group consisting of: hollow silica particles, silica particles, nano silicate particles, porogen particles, etc.

Additionally or alternatively, the low-refractive film LR may include a compound expressed in Chemical Formula 1 below:

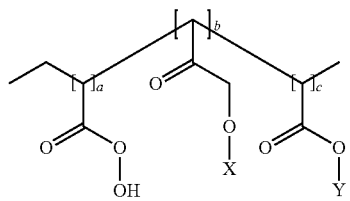

Chemical Formula 1 where a, b and c are integers from 1 to 6. In Chemical Formula 1, X may be a functional group capable of crosslinking, e.g., X may be a crosslinking agent in Chemical Formula 1.

In Chemical Formula 1, Y may be one selected from fluorine functional groups. For example, the fluorine functional groups may include a compound expressed by Chemical Formula 2 and a compound expressed by Chemical Formula 3 below:

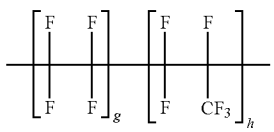

Chemical Formula 2

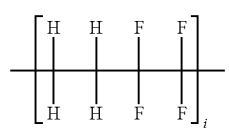

Chemical Formula 3 where each of g, h and i is an integer selected from 1 to 6.

The refractive indices of the compounds may range from about 1.34 to about 1.57. Accordingly, when the low-refractive film LR includes the compound, the refractive index of the low-refractive film LR may be adjusted by adjusting the amount of the compound. Furthermore, it is possible to meet the above-described refractive index range. It is, however, to be understood that the present disclosure is not limited thereto. The material that may be included in the low-refractive pattern LR is not limited as long as it is a material having a refractive index within the above-described range or a mixture of a plurality of materials.

Because the high-refractive patterns HR being is in the emission area EMA and the low-refractive film LR is on the high-refractive patterns HR, light emission efficiency of the lights L2 and L3 emitted from the emissive layer can be improved. For example, even if light L2 and L3 travels to the outside through the side surfaces of the high-refractive pattern HR, light L2 and L3 may be refracted in a direction toward the upper side due to the difference in refractive index between the high-refractive pattern HR and the low-refractive film LR, disposed on the side surfaces of the high-refractive pattern HR. Accordingly, the light path toward the sides of the display device 1 (e.g., see FIG. 1) can be changed toward the front of the display device 1. This may produce an improvement in light emission efficiency of the display device 1.

Simulations have been conducted to validate such results. For example, relative efficiency was measured for different thicknesses and refractive indices of the high-refractive pattern HR in the structure where the high-refractive pattern HR is disposed in the emission area EMA and the low-refractive film LR is stacked over the high-refractive pattern HR, as shown in FIGS. 8 and 9. In accordance with one embodiment, relative efficiency may refer to the amount of light (in percentage) relative to the amount of light emitted from the emissive layer and extracted at the front of the display device 1 (e.g., see FIG. 1) when the light path change layer LWL is not disposed.

FIGS. 10 to 13 are graphs showing examples of relative efficiency versus taper angle of the high-refractive pattern according to an embodiment. In each of the graphs of FIGS. 10 to 13, the horizontal axis represents the taper angle θ of the high-refractive patterns HR, and the vertical axis represents the relative efficiency.

Figure 10:
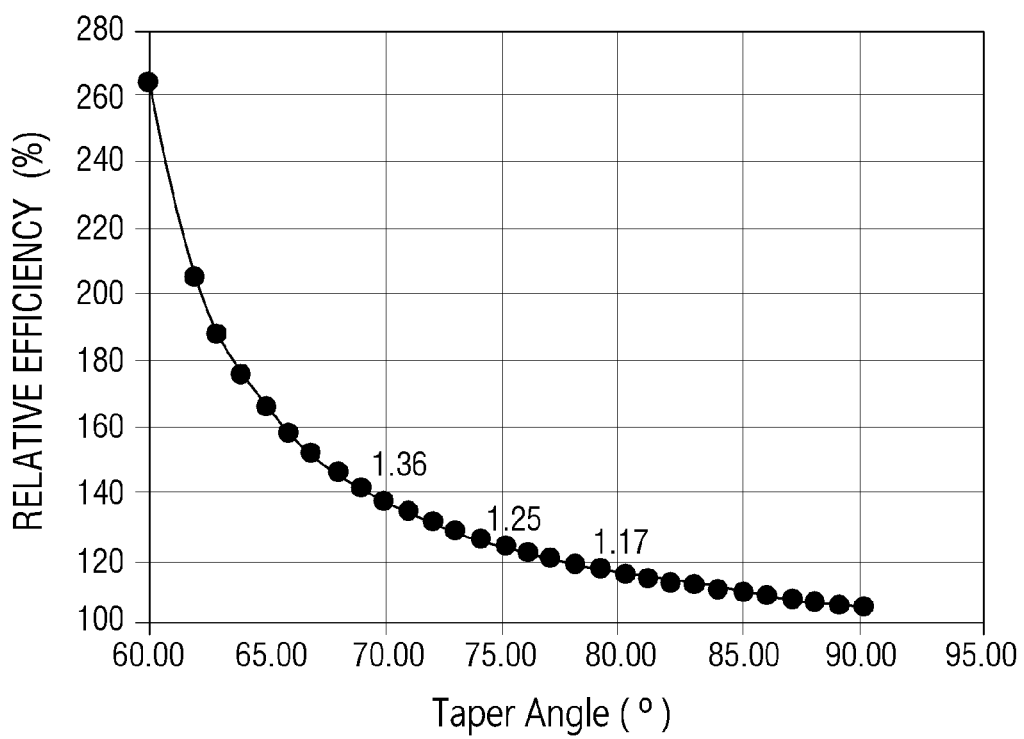
FIGS. 10 to 13 illustrates relative efficiency versus taper angle of a high-refractive pattern according to an embodiment.

In the example shown FIG. 10 the thickness of the high-refractive patterns HR is about 1.8 μm, the refractive index of the high-refractive patterns HR is about 1.7, and the refractive index of the low-refractive film LR is about 1.46. In the example shown FIG. 11 the thickness of the high-refractive pattern HR is about 1.8 μm, the refractive index of the high-refractive pattern HR is about 1.6, and the refractive index of the low-refractive film LR is about 1.46. In the example shown FIG. 12 the thickness of the high-refractive pattern HR is about 1.2 μm, the refractive index of the high-refractive pattern HR is about 1.53, and the refractive index of the low-refractive film LR is about 1.46. In the example shown FIG. 13 the thickness of the high-refractive pattern HR is about 1.5 μm, the refractive index of the high-refractive pattern HR is about 1.65, and the refractive index of the low-refractive film LR is about 1.46.

Figure 11:
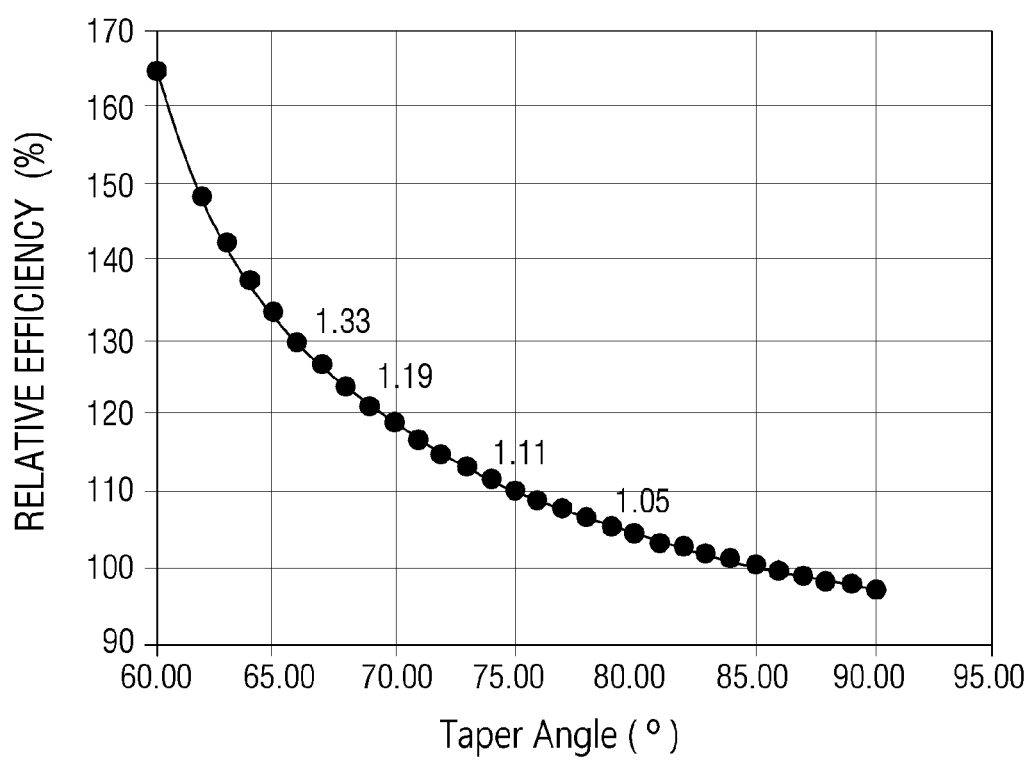

In addition, in the example shown in FIG. 11, the distance (on one side) between the high-refractive pattern HR and the organic layer 175 of the emissive layer is about 2.5 μm. In the example shown in FIG. 12, the distance (on one side) between the high-refractive pattern HR and the organic layer 175 of the emissive layer is about 4.0 μm. In the example shown in FIG. 12, the distance (on one side) between the high-refractive pattern HR and the organic layer 175 of the emissive layer is about 3.0 μm.

Referring to FIG. 10, the relative efficiency is greater than 100% when the high-refractive pattern HR and the low-refractive film LR are disposed, irrespective of the taper angle of the high-refractive pattern HR. Accordingly, it can be seen that the light emission efficiency is improved when the light path change layer LWL (e.g., see FIG. 9) is disposed. For example, when the taper angle is 70 degrees, relative efficiency is approximately 138%, when the taper angle is 75 degrees, relative efficiency is approximately 125%, and when the taper angle is 80 degrees, relative efficiency is approximately 117%. Thus, the smaller the taper angle, the larger the relative efficiency.

Referring to FIG. 11, when the taper angle of the high-refractive patterns HR is less than about 85 degrees, the relative efficiency is greater than 100%. Accordingly, it can be seen that light emission efficiency is improved when the light path change layer LWL (e.g., see FIG. 9) is disposed and the taper angle of the high-refractive patterns HR is less than about 85 degrees. For example, when the taper angle is 65 degrees, relative efficiency is approximately 133%, when the taper angle is 70 degrees, relative efficiency is approximately 119%, when the taper angle is 75 degrees, relative efficiency is approximately 111%, and when the taper angle is 80 degrees, the relative efficiency is approximately 105%. Thus, the smaller the taper angle, the larger the relative efficiency.

Figure 12:
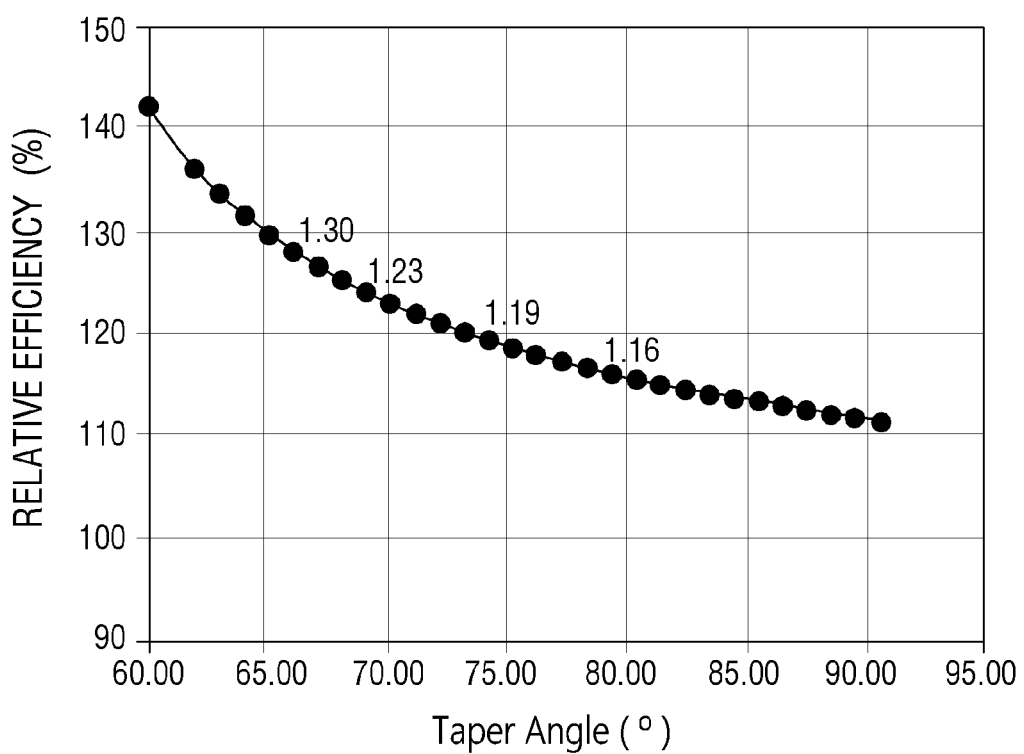

Referring to FIG. 12, the relative efficiency is greater than 100% when the high-refractive patterns HR and the low-refractive film LR are disposed, irrespective of the taper angle of the high-refractive patterns HR. Accordingly, it can be seen that light emission efficiency is improved when the light path change layer LWL (e.g., see FIG. 9) is disposed. For example, when the taper angle is 65 degrees, relative efficiency is approximately 130%, when the taper angle is 70 degrees, the relative efficiency is approximately 123%, when the taper angle is 75 degrees, relative efficiency is approximately 119%, and when the taper angle is 80 degrees, relative efficiency is approximately 116%. Thus, the smaller the taper angle, the larger the relative efficiency.

Figure 13:
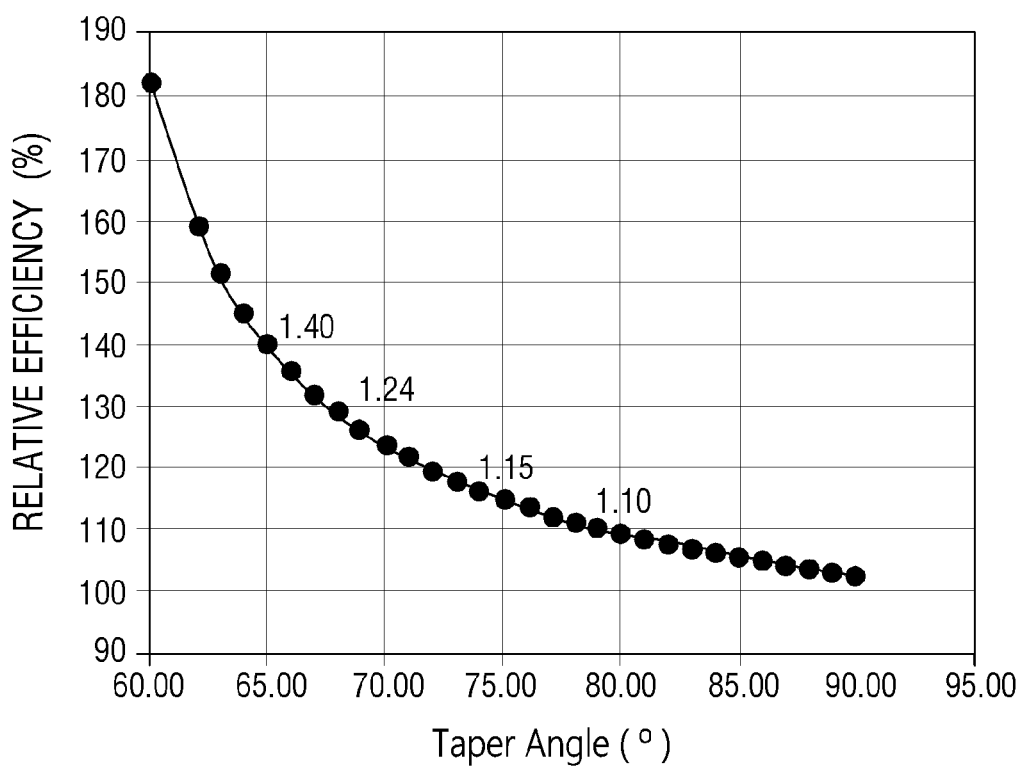

Referring to FIG. 13, the relative efficiency is greater than 100% when the high-refractive pattern HR and the low-refractive film LR are disposed, irrespective of the taper angle of the high-refractive pattern HR. Accordingly, it can be seen that light emission efficiency is improved when the light path change layer LWL (e.g., see FIG. 9) is disposed. In one embodiment, when the taper angle is about 65 degrees, relative efficiency is approximately 140%, when the taper angle is about 70 degrees, relative efficiency is approximately 124%, when the taper angle is about 75 degrees, relative efficiency is approximately 115%, and when the taper angle is about 80 degrees, relative efficiency is approximately 110%. Thus, the smaller the taper angle, the larger the relative efficiency.

Because the high-refractive pattern HR is in the emission area EMA and the low-refractive film LR is stacked over the high-refractive pattern HR, light emission efficiency can be improved. Additionally, the light L1, L2 and L3 emitted from the emissive layer can be more concentrated, so that it is possible to suppress or prevent defects such as reflected color lines. Furthermore, the luminance of the display device 1 (e.g., see FIG. 1) can be improved and white angle difference (WAD) can be improved.

As the low-refractive film LR is over the high-refractive pattern HR, the high-refractive pattern HR may be formed and then the low-refractive film LR may be formed. For example, a first photosensitive organic material may be applied, exposed to light and developed to form the high-refractive pattern HR in the emission area EMA, and then a second photosensitive organic material may be applied to form the low-refractive film LR covering the high-refractive pattern HR. Because the low-refractive film LR is formed after the high-refractive patterns HR has been formed, it is possible to suppress or prevent defects such as swelling of the low-refractive film LR and/or the high-refractive patterns HR.

Table 1 shows an example of the swelling length of the high-refractive pattern HR over time when the high-refractive pattern HR is patterned and then the low-refractive film LR is disposed over it and cured with ultraviolet (UV) rays. The swelling length of the high-refractive pattern HR over time means a change in the thickness of the high-refractive pattern HR, and exhibits the results measured at two points (Point 1 and Point 2) of the high-refractive pattern HR.

TABLE 1

| Delay(min) | Thickness | | | Swelling Length(μm) |
| | Point 1 | Point 2 | Average | |
|---|---|---|---|---|
| 0 | 1.499 | 1.499 | 1.499 | |
| 1 | 1.529 | 1.529 | 1.529 | 0.030 |

TABLE 1-continued

| Delay(min) | Thickness | | | Swelling Length(μm) |
| --- | --- | --- | --- | --- |
| | Point 1 | Point 2 | Average | |
| 5 | 1.529 | 1.595 | 1.544 | 0.045 |
| 10 | 1.595 | 1.529 | 1.544 | 0.045 |

Even though the high-refractive pattern HR is patterned and then the low-refractive film LR is formed and cured with ultraviolet (UV) rays, the change in the thickness of the high-refractive pattern HR is less than 0.2 μm, even than 0.05 μm. In such case, substantially no swelling defects may occur.

In addition, when the high-refractive pattern HR and the low-refractive film LR are developed, the developer may be tetra methyl ammonium hydroxide (TMAH). When the developer is TMAH, it is possible to reduce damage to the second touch conductive layer 220 not covered by the high-refractive pattern HR, and a conductive layer at pad areas that is not covered by the high-refractive pattern HR or the low refractive layer LR but is exposed to the outside. The conductive layer at the pad areas may form the same conductive layer as the second touch conductive layer 220 or may form the same conductive layer as the first touch conductive layer 210. It is, however, to be understood that the present disclosure is not limited thereto.

Accordingly, because the low-refractive film LR is over the high-refractive pattern HR, reliability of the display device 1 can be improved and the thickness of the display device 1 can be reduced (e.g., see FIG. 1). In addition, the thickness of the low-refractive film LR can be reduced. If the display device 1 (e.g., see FIG. 1) is a flexible display device, flexibility characteristics can be improved.

Referring back to FIGS. 8 and 9, an anti-reflection layer RPL is on the low-refractive film LR and a protective layer WDL is on the anti-reflection layer RPL. An adhesive layer OC may be disposed between the anti-reflection layer RPL and the protective layer WDL. The anti-reflection layer RPL and the protective layer WDL may be bonded by the adhesive layer OC. The adhesive layer OC may be optically transparent and, for example, may include a transparent adhesive member such as an optically clear adhesive (OCA) film and an optically clear resin (OCR).

When the anti-reflection layer RPL is implemented as a polarizing film, the low-refractive film LR, the anti-reflection layer RPL and the adhesive layer OC may include substantially the same refractive index. Thus, it is possible to suppress or prevent refraction or total reflection at the boundaries of the elements. As a result, light emission efficiency can be improved and reflection of external light can be reduced.

Hereinafter, other embodiments of the present disclosure will be described. In the following description, the same or similar elements will be denoted by the same or similar reference numerals, and redundant descriptions will be omitted or briefly described. Descriptions will be made focusing on differences from the above embodiment.

Figure 14:
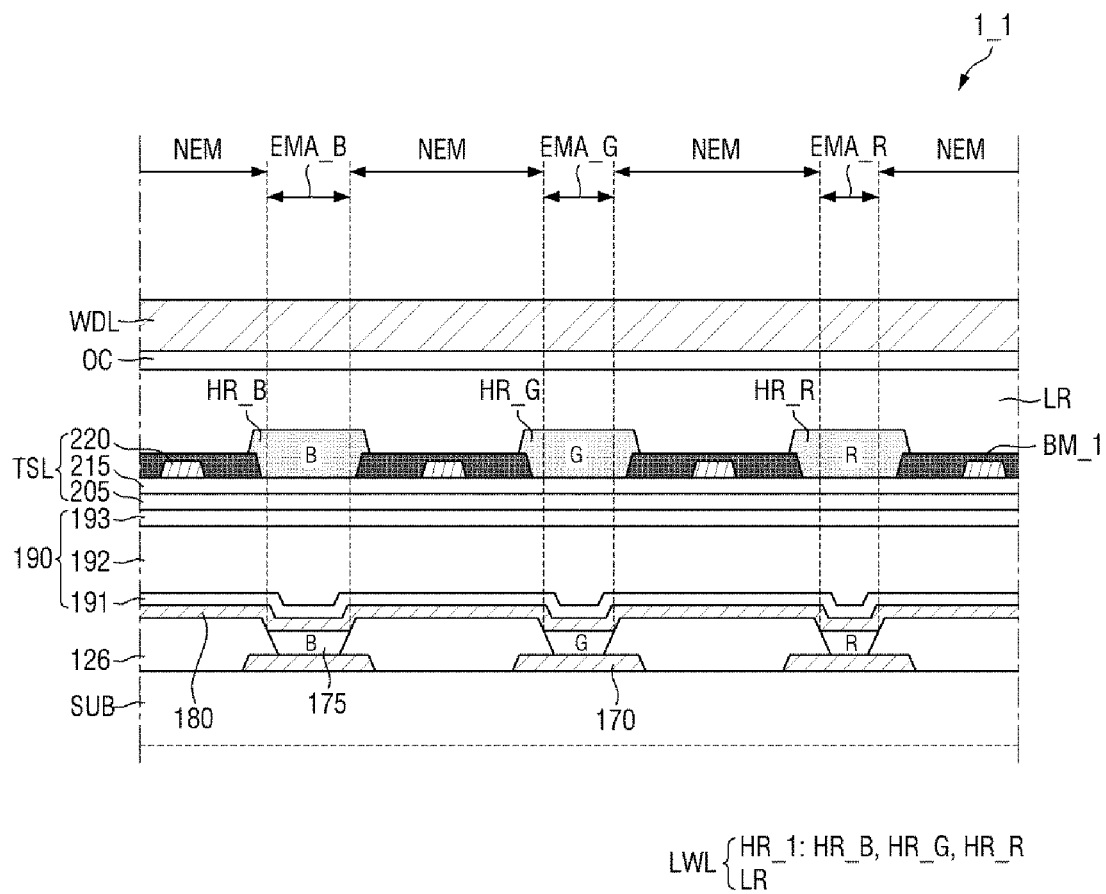
FIG. 14 illustrates an embodiment of a display device.

FIG. 14 is a cross-sectional view of an embodiment of a display device 1_1, which may be different from the embodiment of FIG. 9 in that it may further include a pigment or a dye. For example, high-refractive pattern HR_1 may selectively transmit light of a particular color. Although not limited thereto, for example, the high-refractive pattern HR_1 may further include a colorant such as a dye and pigment that absorbs wavelengths other than the wavelength of a particular color. In such case, the high-refractive pattern HR_1 may be implemented as a color filter.

The high-refractive pattern HR_1 may include a first high-refractive pattern HR_R, a second high-refractive pattern HR_B, and a third high-refractive pattern HR_G. The first high-refractive pattern HR_R may be in the emission area EMA_R of the first color pixel, the second high-refractive pattern HR_B may be in the emission area EMA_B of the second color pixel, and the third high-refractive pattern HR_G may be in the emission area EMA_G of the third color pixel.

For example, the first high-refractive pattern HR_R may be a red color filter layer, the second high-refractive pattern HR_B may be a blue color filter layer, and the third high-refractive pattern HR_G may be a green color filter layer. That is to say, the first high-refractive pattern HR_R may selectively transmit red light, the second high-refractive pattern HR_B may selectively transmit blue light, and the third high-refractive pattern HR_G may selectively transmit green light. In such case, the first high-refractive pattern HR_R may further include a red pigment or dye, the second high-refractive pattern HR_B may further include a blue pigment or dye, and the third high-refractive pattern HR_G may further include a green pigment or dye.

Although the high-refractive pattern HR_1 is in the emission area EMA in the foregoing description, it is to be understood that the high-refractive pattern HR_1 may be in the non-emission area NEM around the emission area EMA as well as the emission area EMA in other embodiments When the high-refractive pattern HR_1 is implemented as a color filter, the anti-reflection layer RPL may be eliminated. Accordingly, the thickness of the display device 1_1 can be reduced, and if the display device 1_1 is a flexible display device flexibility characteristics can be improved.

In addition, the display device 1_1 may further include a black matrix BM_1 in the non-emission area NEM. The black matrix BM_1 may be between the high-refractive patterns HR and may be implemented as a single piece. It is, however, to be understood that the present disclosure is not limited thereto. The black matrix BM_1 may overlap with the high-refractive pattern HR_1 in the non-emission area NEM in the thickness direction (third direction DR3), but the present disclosure is not limited thereto. The black matrix BM_1 may cover a second touch conductive layer 224. The black matrix BM_1 may include a light-absorbing material that absorbs light at visible wavelengths. For example, the black matrix BM_1 may be a kind of light-blocking member.

In one embodiment, an anti-reflection film may be disposed between the cathode electrode 180 and the first inorganic film 191. The anti-reflection film can reduce reflection of external light incident on the cathode electrode 180. For example, destructive interference may occur between the light reflected at the anti-reflection film and the light reflected at the cathode electrode 180, and it is possible to suppress or prevent reflection of light incident toward the cathode electrode 180. The anti-reflection film may include an inorganic film. For example, the anti-reflection film may include at least one of titanium (Ti), molybdenum (Mo) or bismuth (Bi) or may have a stack structure of titanium (Ti)/molybdenum (Mo).

In one embodiment, the low-refractive film LR may be over the high-refractive pattern HR_1 and the black matrix BM_1 and may cover the high-refractive pattern HR_1 and the black matrix BM_1. An inorganic film may be on the first touch insulating layer 215. The inorganic film may cover the second touch conductive layer 220, and the high-refractive pattern HR_1 and the black matrix BM_1 may be on the inorganic film.

When the high-refractive pattern HR_1 includes a colorant such as a dye and pigment that absorbs wavelengths other than the wavelength of a particular color, the high-refractive pattern HR_1 may not include the above-described first nanoparticles. If the high-refractive pattern HR_1 does not include the first nanoparticles but includes the colorant, it may further include an aromatic resin to meet the above-described refractive index by mixing it with the organic material. As the high-refractive pattern HR_1 does not include the above-described first nanoparticles, the viscosity of the high-refractive pattern HR_1 may be lowered. As a result, it can be discharged more stably.

In one embodiment, the high refractive patterns HR_1 for selectively transmitting light of different colors may be formed via different processes, respectively, and the thickness of each of the high refractive patterns HR_1 for selectively transmitting light of different colors may be adjusted individually. In this manner, light emission efficiency for different wavelengths of visible light can be individually adjusted, so that overall light emission efficiency can be further improved and color quality of the display device 1_1 can be improved.

Even if the high-refractive pattern HR_1 includes a colorant but does not include the above-described first nanoparticles, light emission efficiency can be improved by disposing the low-refractive film LR over the high-refractive pattern HR_1. Simulations have been conducted to validate such results. For example, relative efficiency was measured for different thicknesses of the high-refractive patterns HR_R, HR_B and HR_G in the structure where the high-refractive patterns HR including the colorant is disposed in the emission area EMA and the low-refractive film LR is stacked over the high-refractive pattern HR, as shown in FIG. 14.

Figure 15:
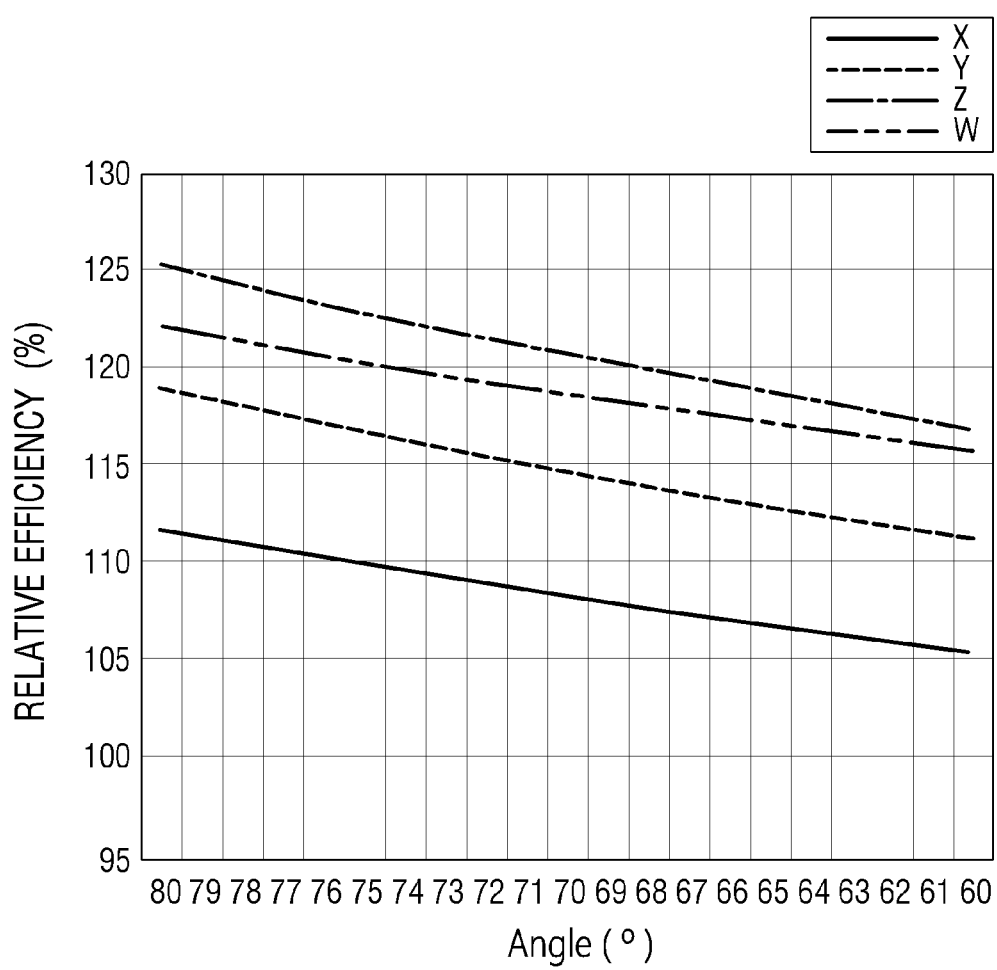
FIG. 15 illustrates relative efficiency versus thickness of a high-refractive pattern according to an embodiment.

FIG. 15 is a graph showing an embodiment of relative efficiency versus thickness of the high-refractive pattern. In the graph of FIG. 15, the horizontal axis represents taper angle of the high-refractive pattern HR_1 and vertical axis represents relative efficiency.

Referring to FIG. 15, Line X indicates that the thicknesses of the first to third high-refractive patterns HR_R, HR_B and HR_G are all 2.2 μm. In addition, on Line X, the distance of the first high-refractive pattern HR_R is 24 μm, the distance of the second high-refractive pattern HR_B is 25 μm, and the distance of the third high-refractive pattern HR_G is 20 μm.

Line Y represents an example where the thickness of the first and second high-refractive patterns HR_R and HR_B is 3 μm and the thickness of the third high-refractive pattern HR_G is 2.2 μm. In addition, on Line Y, the distance of the first high-refractive pattern HR_R is 24 μm, the distance of the second high-refractive pattern HR_B is 25 μm, and the distance of the third high-refractive pattern HR_G is 22 μm.

Line Z represents an example where the thicknesses of the first to third high-refractive patterns HR_R, HR_B and HR_G are all 3 μm. In addition, on Line Z, the distance of the first high-refractive pattern HR_R is 24 μm, distance of the second high-refractive pattern HR_B is 25 μm, and the distance of the third high-refractive pattern HR_G is 22 μm.

Line W represents an example where the thicknesses of the first to third high-refractive patterns HR_R, HR_B and HR_G are all 2.2 μm. In addition, on Line Z, the distance of the first high-refractive pattern HR_R is 24 μm, the distance of the second high-refractive pattern HR_B is 25 μm, and the distance of the third high-refractive pattern HR_G is 24 μm.

In the example of FIG. 15, the distance may refer to the width of each of the high-refractive patterns HR_R, HR_B and HR_G disposed above the respective organic layers 175 when viewed from the top. When the high-refractive patterns HR_R, HR_B and HR_G include a rectangular or square shape when viewed from the top, the length of the longest side thereof may be the distance. In addition, when the high-refractive patterns HR_R, HR_B and HR_G have a circular or elliptical shape when viewed from the top, the distance may refer to the diameter thereof.

Referring to FIG. 15, the relative efficiency is greater than 100% for all of Lines X, Y, Z and W when the high-refractive pattern HR_1 includes the colorant and the low-refractive film LR is over the high-refractive pattern HR_1, irrespective of the taper angle of the high-refractive pattern HR_1. Thus, the smaller the taper angle, the larger the relative efficiency. Accordingly, it can be seen that even if the high-refractive pattern HR_1 includes the colorant but does not include the above-described first nanoparticles, by disposing the low-refractive film LR over the high-refractive pattern HR_1, light emission efficiency can be improved.

Figure 16:
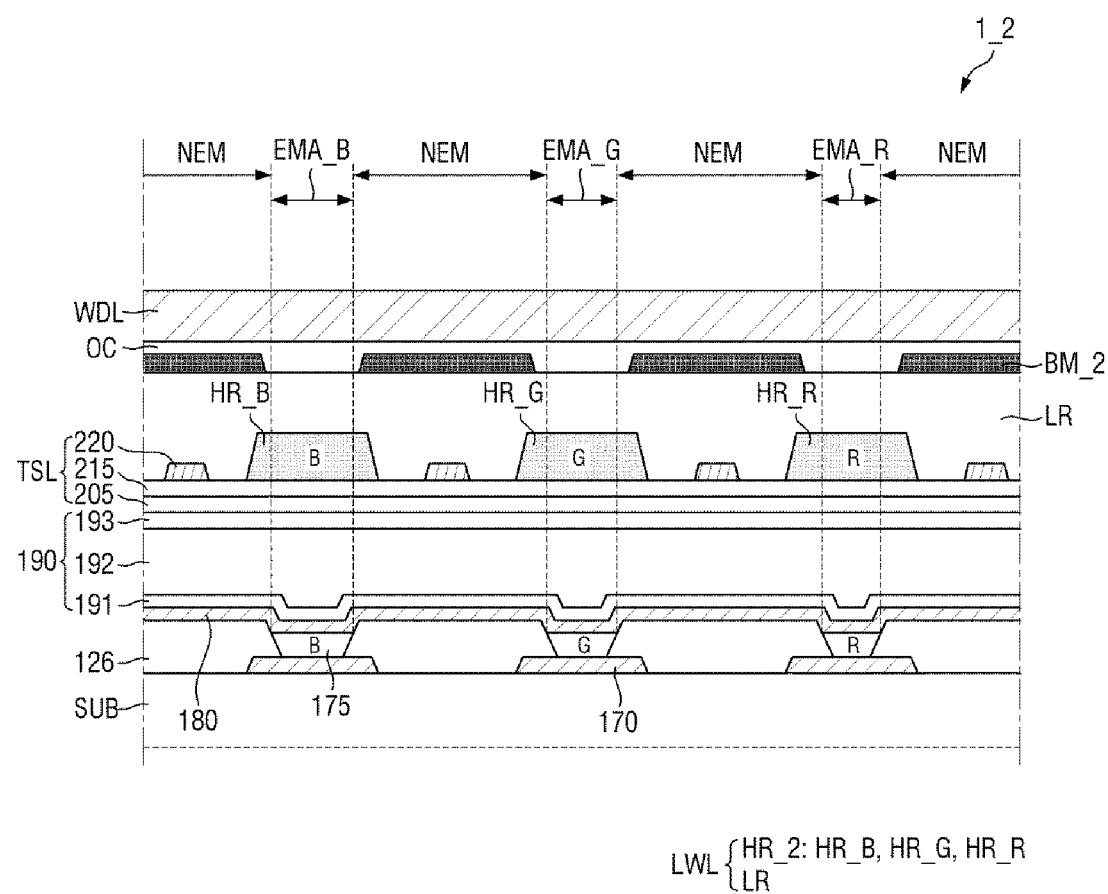
FIG. 16 illustrates an embodiment of a display device.

FIG. 16 is a cross-sectional view of an embodiment of a display device a display device 1_2, which is different from the display device of FIG. 14 in that a black matrix BM_2 is on a low-refractive film LR.

Referring to FIG. 16, the black matrix BM_2 may be in the non-emission area NEM and on the low-refractive film LR. The black matrix BM_2 may be on the low-refractive film LR. An adhesive layer OC is over the black matrix BM_2 and may cover the black matrix BM_2.

A second touch conductive layer 220 may be covered by at least one of the first to third high-refractive patterns HR_R, HR_B and HR_G. For example, the second touch conductive layer 220 may be covered by at least one of the first to third high-refractive patterns HR_R, HR_B and HR_G or the first to third high-refractive patterns HR_R, HR_B and HR_G may be stacked on the second touch conductive layer 220.

Even in this instance, the low-refractive film LR is stacked over the high-refractive pattern HR_2, so that the light emission efficiency of the display device 1_2 can be improved. In addition, as the black matrix BM_2 is on the low-refractive film LR, the low-refractive film LR may be disposed more to the outside of the display device 1_2, so that reflection of external light can be further reduced and it is possible to suppress or prevent defects such as reflected color lines.

Figure 17:
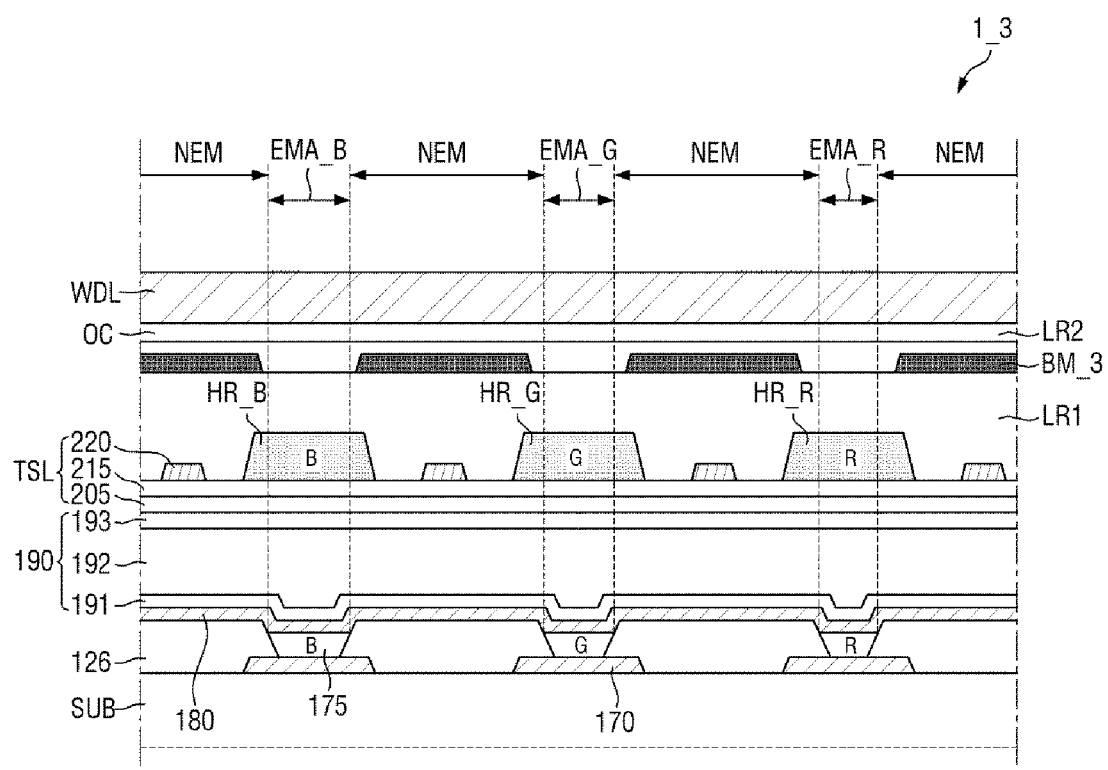
FIG. 17 illustrates an embodiment of a display device.

FIG. 17 is a cross-sectional view of an embodiment of a display device 1_3, which is different from the display device of FIG. 16 in that a low-refractive film LR_3 is further disposed above a black matrix BM_3. The low-refractive film LR_3 may include a first low-refractive film LR1 and a second low-refractive film LR2 sequentially stacked. The black matrix BM_3 may be on the first low-refractive film LR1, and the second low-refractive film LR2 may be over the black matrix BM_3 to cover the black matrix BM_3. An adhesive layer OC may be on the second low-refractive film LR2.

Even in this instance, the low-refractive film LR_3 is stacked over the high-refractive pattern HR_3, so that light emission efficiency of the display device 1_3 can be improved. In addition, because the black matrix BM_3 is on the first low-refractive film LR1, the low-refractive film LR may be more to the outside of the display device 1_3, so that reflection of external light can be further reduced and defects such as reflected color lines may be suppressed or prevented.

Figure 18:
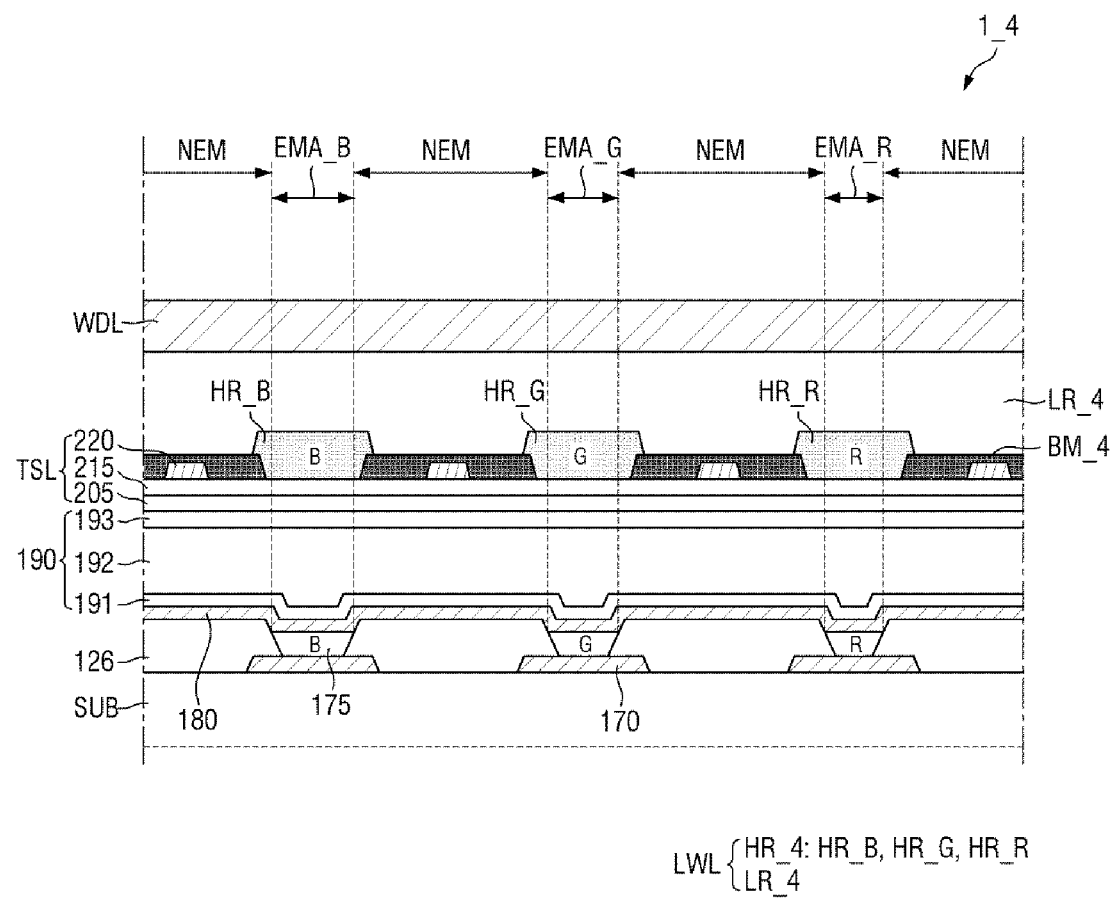
FIG. 18 illustrates an embodiment of a display device.

FIG. 18 is a cross-sectional view of an embodiment of a display device 1_4, which is different from the display device of FIG. 14 in that the adhesive layer OC is omitted. According to this embodiment, a low-refractive film LR_4 may include an adhesive or a pressure-sensitive adhesive. In this instance, a protective layer WDL may be attached by the low-refractive film LR_4, and the adhesive layer OC for attaching the protective layer WDL thereon may be omitted. In this instance, the low-refractive film LR_4 is stacked over the high-refractive pattern HR_4, so that the light emission efficiency of the display device 1_4 can be improved. Additionally, the thickness of the display device 1_4 can be reduced because the adhesive layer OC is omitted.

Figure 19:
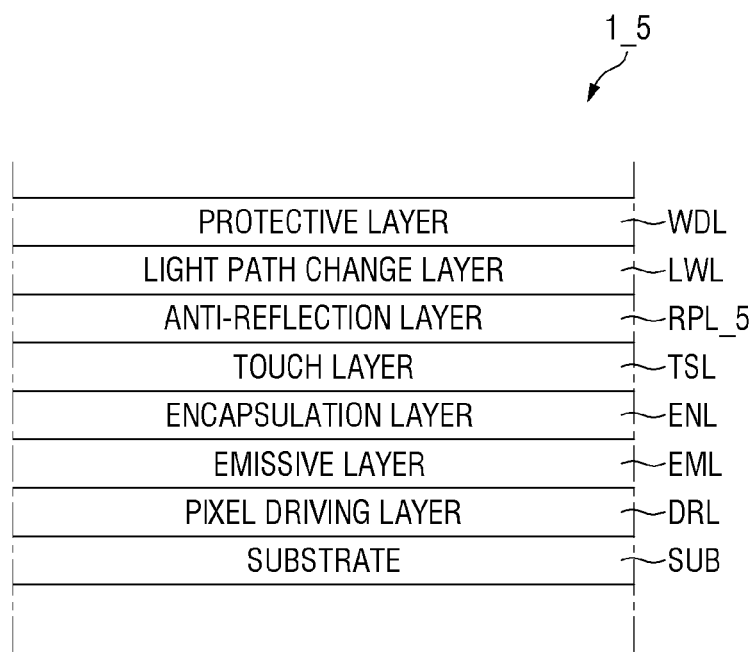
FIG. 19 illustrates an embodiment of a display device.
Figure 20:
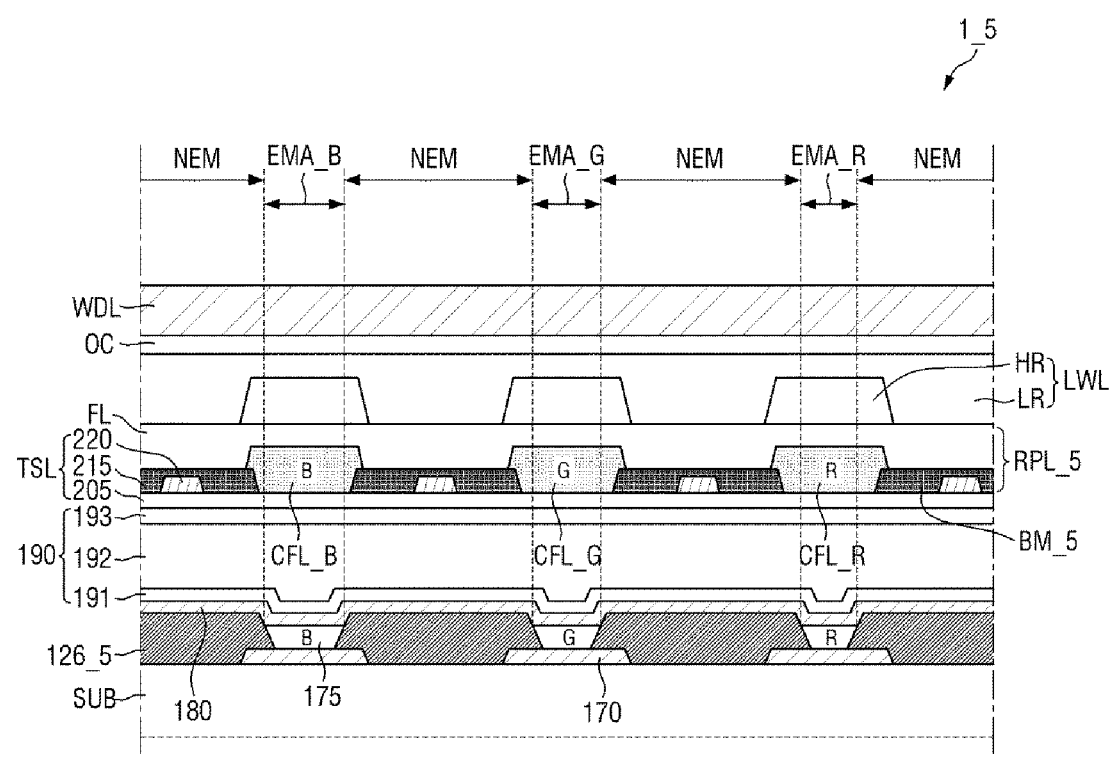
FIG. 20 illustrates a cross-sectional view of the display device in FIG. 19.

FIG. 19 is a view schematically showing a cross section of an embodiment of a display device 1_5, and FIG. 20 illustrates a cross-sectional view of the display device 1_5 of FIG. 19. In the cross-sectional view of FIG. 20, most of the layers under anode electrode 170 are not depicted and the structure above the organic light-emitting element is mainly shown.

Referring to FIGS. 19 and 20, the display device 1_5 is different from the display device of FIGS. 2 and 9 in that a light path change layer LWL is on an anti-reflection layer RPL_5. For example, the anti-reflection layer RPL_5 may be on a touch layer TSL of the display device 1_5 and the light path change layer LWL may be on the anti-reflection layer RPL_5. Thus, the anti-reflection layer RPL_5 may be disposed between the touch layer TSL and the light path change layer LWL.

In this instance, the anti-reflection layer RPL_5 may serve as a color filter layer, e.g., the anti-reflection layer RLP_5 may include a colorant such as a dye and pigment that absorbs wavelengths other than the wavelength of a particular color. The anti-reflection layer RLP_5 may selectively transmit light of the particular color.

In one embodiment, the anti-reflection layer RPL_5 may include a first color filter layer CFL_R, a second color filter layer CFL_B, a third color filter layer CFL_G, and a black matrix BM_5. The first color filter layer CFL_R may be a red color filter layer, the second color filter layer CFL_B may be a blue color filter layer, and the third color filter layer CFL_G may be a green color filter layer. That is, the first color filter layer CFL_R may selectively transmit red light, the second color filter layer CFL_B may selectively transmit blue light, and the third color filter layer CFL_G may selectively transmit green light.

The first color filter layer CFL_R may be in the first emission area EMA_R and its periphery, the second color filter layer CFL_B may be in the second emission area EMA_B and its periphery, and the third color filter layer CFL_G may be in the third emission area EMA_G and its periphery. The black matrix BM_5 may be in the non-emission areas NEM, may overlap the color filter layers CFL_R, CFL_B and CFL_G, and may block light emission directed toward the adjacent emission areas EMA.

A planarization layer FL may be over the first color filter layer CFL_R, the second color filter layer CFL_B, the third color filter layer CFL_G, and the black matrix BM_5. The planarization layer FL may include an organic material, in which case the upper surface may be substantially flat despite level differences thereunder. It is, however, to be understood that the present disclosure is not limited thereto. In one embodiment, the planarization layer FL may be omitted.

The light path change layer LWL may be on the anti-reflection layer RPL_5. When the planarization layer FL is omitted, the high-refractive pattern HR may be on the color filter layers CFL_R, CFL_B and CFL_G. The low-refractive film LR may be over the high-refractive pattern HR and the color filter layers CFL_R, CFL_B and CFL_G to cover the high-refractive pattern HR and the color filter layers CFL_R, CFL_B and CFL_G. Even when the planarization layer FL is omitted, the low-refractive film LR may provide a substantially flat upper surface.

When the anti-reflection layer RPL_5 is implemented as the color filter layer, a bank layer 126_5 may include a light-absorbing material. The light-absorbing material may be substantially the same as described above. Because the bank layer 126_5 includes a light-absorbing material, it is possible to suppress or prevent light from the emissive layer to be directed towards the side surface. Furthermore, it is possible to suppress or prevent defects such as light leakage even without using a polarizing film.

Even in this instance, the low-refractive film LR is stacked over the high-refractive pattern HR, so that light emission efficiency of the display device 1_5 can be improved. Additionally, the anti-reflection layer RPL_5 is implemented as the color filter instead of a polarizing film, so that the thickness of the display device 1_5 can be reduced, and if the display device 1_5 is a flexible display device flexibility characteristics can be improved.

In addition, in the case where the polarizing film is omitted in the embodiments of FIGS. 14 and 16 to 18, the bank layer 126 may include the above-described light-absorbing material.

Those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

What is claimed is:

1. A display device, comprising:
 a substrate;
 a plurality of first electrodes on the substrate;
 a second electrode above the plurality of first electrodes;
 an emissive layer between the plurality of first electrodes and the second electrode;
 an encapsulation layer on the second electrode;
 a touch layer on the encapsulation layer and comprising a touch electrode;
 a plurality of refractive patterns spaced apart from one another and disposed on the touch layer to overlap the emissive layer;
 a refractive film covering the plurality of refractive patterns, wherein each of the plurality of refractive patterns and the refractive film comprise an organic material, and wherein a refractive index of the refractive film is less than a refractive index of each of the plurality of refractive patterns;
 an adhesive layer on the refractive film; and
 an anti-reflection layer between the touch layer and the plurality of refractive patterns,
 wherein the anti-reflection layer comprises a first filter of a first color that selectively transmits light of the first color, a second filter of a second color that selectively transmits light of the second color, and a third filter of a third color that selectively transmits light of the third color,
 wherein the first color, the second color and the third color are different from each other,
 wherein the refractive index of the refractive film is substantially equal to a refractive index of the adhesive layer.

2. The display device of claim 1, further comprising:
a protective layer on the adhesive layer.

3. The display device of claim 1, wherein the anti-reflection layer comprises a black matrix on the refractive film.

4. The display device of claim 3, further comprising:
a bank layer on the plurality of first electrodes and comprising an opening exposing the plurality of first electrodes, wherein:
the emissive layer is on the plurality of first electrodes exposed by the bank layer, and
the bank layer comprises a light-absorbing material.

5. The display device of claim 1, wherein:
the emissive layer includes a plurality of organic layers that correspond to a respective plurality of colors of light, the plurality of refractive patterns co-extends with part of the emissive layer, and wherein each of the plurality of organic layers of the emissive layer coextends with part of the plurality of refractive patterns, respectively.

6. The display device of claim 5, wherein the emissive layer co-extends with part of the refractive film.

7. The display device of claim 1, wherein:
the refractive index of the plurality of refractive patterns ranges from about 1.53 to about 1.8, and
the refractive index of the refractive film ranges from about 1.46 to about 1.48.

8. The display device of claim 7, wherein:
each of the plurality of refractive patterns comprises zirconia, and
the refractive film comprises a fluorinated monomer.

9. The display device of claim 1, wherein an upper surface of the refractive film is substantially flat.

10. The display device of claim 1, wherein the refractive film comprises a pressure-sensitive adhesive or an adhesive.

11. The display device of claim 1, wherein each of the plurality of refractive patterns comprises a colorant.

12. The display device of claim 1, wherein the plurality of refractive patterns comprises:
a first refractive pattern comprising a pigment or dye of the first color and selectively transmits light of the first color,
a second refractive pattern comprising a pigment or dye of the second color and selectively transmits light of the second color, and
a third refractive pattern comprising a pigment or dye of the third color and selectively transmits light of the third color.

13. The display device of claim 1, wherein the refractive film comprises a low-refractive film.

14. The display device of claim 13, wherein a refractive index of the anti-reflection layer is substantially equal to the refractive index of the low-refractive film and the refractive index of the adhesive layer.

15. A display device, comprising:
a substrate;
a plurality of first electrodes on the substrate;
a second electrode above the plurality of first electrodes;
an emissive layer between the plurality of first electrodes and the second electrode;
an encapsulation layer on the second electrode;
a touch layer on the encapsulation layer and comprising a touch electrode;
a plurality of refractive patterns spaced apart from one another and disposed on the touch layer to overlap the emissive layer; and
a refractive film covering the plurality of refractive patterns,
wherein each of the plurality of refractive patterns and the refractive film comprise an organic material, and wherein a refractive index of the refractive film is less than a refractive index of each of the plurality of refractive patterns,
wherein the display device further comprises:
an adhesive layer on the refractive film,
a protective layer on the adhesive layer, and
an anti-reflection layer between the refractive film and the adhesive layer,
wherein the refractive index of the refractive film is substantially equal to a refractive index of the adhesive layer,
wherein a refractive index of the anti-reflection layer is substantially equal to the refractive index of the refractive film and the refractive index of the adhesive layer, and wherein the anti-reflection layer includes a polarizing film.

16. A display device, comprising:
a substrate;
a plurality of first electrodes on the substrate;
a second electrode above the plurality of first electrodes;
an emissive layer between each of the plurality of first electrodes and the second electrode;
an encapsulation layer on the second electrode;
a touch layer on the encapsulation layer, the touch layer comprising a touch insulating layer on the encapsulation layer and comprising a touch electrode disposed directly on an upper surface of the touch insulating layer;
a plurality of refractive patterns on the touch layer; and
a refractive film covering the plurality of refractive patterns, wherein each of the plurality of refractive patterns and the refractive film comprises a colorant, and wherein a refractive index of the refractive film is less than a refractive index of each of the plurality of refractive patterns, and wherein each of the plurality of refractive patterns is disposed directly on the upper surface of the touch insulating layer,
wherein the refractive film comprises a fluorinated monomer.

17. The display device of claim 16, wherein:
the plurality of refractive patterns comprises a first refractive pattern comprising a pigment or dye of a first color to selectively transmits light of the first color, a second refractive pattern comprising a pigment or dye of a second color to selectively transmit light of the second color, and a third refractive pattern comprising a pigment or dye of a third color to selectively transmit light of the third color.

18. The display device of claim 16, wherein:
the plurality of refractive patterns comprise zirconia.

19. The display device of claim 16, further comprising:
an adhesive layer on the refractive film; and
a protective layer on the adhesive layer,
wherein the refractive index of the refractive film is substantially equal to a refractive index of the adhesive layer.

20. The display device of claim 16, wherein:
the refractive index of each of the plurality of refractive patterns ranges from about 1.53 to about 1.8, and
the refractive index of the refractive film ranges from about 1.46 to about 1.48.

* * * * *